(12) United States Patent
Imai et al.

(10) Patent No.: US 6,619,132 B2
(45) Date of Patent: Sep. 16, 2003

(54) SENSOR INCLUDING A CIRCUIT LEAD FRAME AND A TERMINAL LEAD FRAME FORMED BY A METAL PLATE

(75) Inventors: Atsushi Imai, Tokyo (JP); Kouzou Yamagishi, Tokyo (JP); Yoshihiro Tomomatsu, Tokyo (JP)

(73) Assignee: Nagano Keiki Co., Ltd., Tokyo (JP)

( * ) Notice: Subject to any disclaimer, the term of this patent is extended or adjusted under 35 U.S.C. 154(b) by 0 days.

(21) Appl. No.: 10/062,787

(22) Filed: Jan. 31, 2002

(65) Prior Publication Data

US 2002/0100331 A1 Aug. 1, 2002

(30) Foreign Application Priority Data

Feb. 1, 2001 (JP) ........................... 2001-025825
Feb. 1, 2001 (JP) ........................... 2001-025826

(51) Int. Cl.$^7$ ................................................ G01L 9/00
(52) U.S. Cl. ............................ 73/753; 73/754; 73/727
(58) Field of Search .......................... 73/753, 726, 756, 73/700, 715, 717, 723, 727, 754, 705

(56) References Cited

U.S. PATENT DOCUMENTS 5,693,936 A * 12/1997 Komachiya et al. ... 250/227.17
5,925,826 A * 7/1999 Kodama et al. ............... 73/726
6,372,625 B1 * 4/2002 Shigeno et al. ............. 257/666
6,414,379 B1 * 7/2002 Chang et al. ................ 257/666

FOREIGN PATENT DOCUMENTS

JP  11-237 291  8/1999

* cited by examiner

*Primary Examiner*—Hezron Williams
*Assistant Examiner*—Alandra N. Ellington
(74) *Attorney, Agent, or Firm*—Flynn, Thiel, Boutell & Tanis, P.C.

(57) ABSTRACT

A pressure sensor (1) has a circuit board (5) having a circuit portion (11) for amplifying an electric signal detected by a pressure detecting element (2C) and attached with an IC die (16), and a terminal (12) for inputting and outputting the electric signal from the circuit portion (11). The circuit portion (11) and the terminal (12) have a frame (11A, 12D) formed by a metal plate, the metal plate being provided with resin molds (14, 15). The circuit portion (11) and the terminal (12) are continuously formed, so that steps for soldering etc. is not necessary.

20 Claims, 23 Drawing Sheets

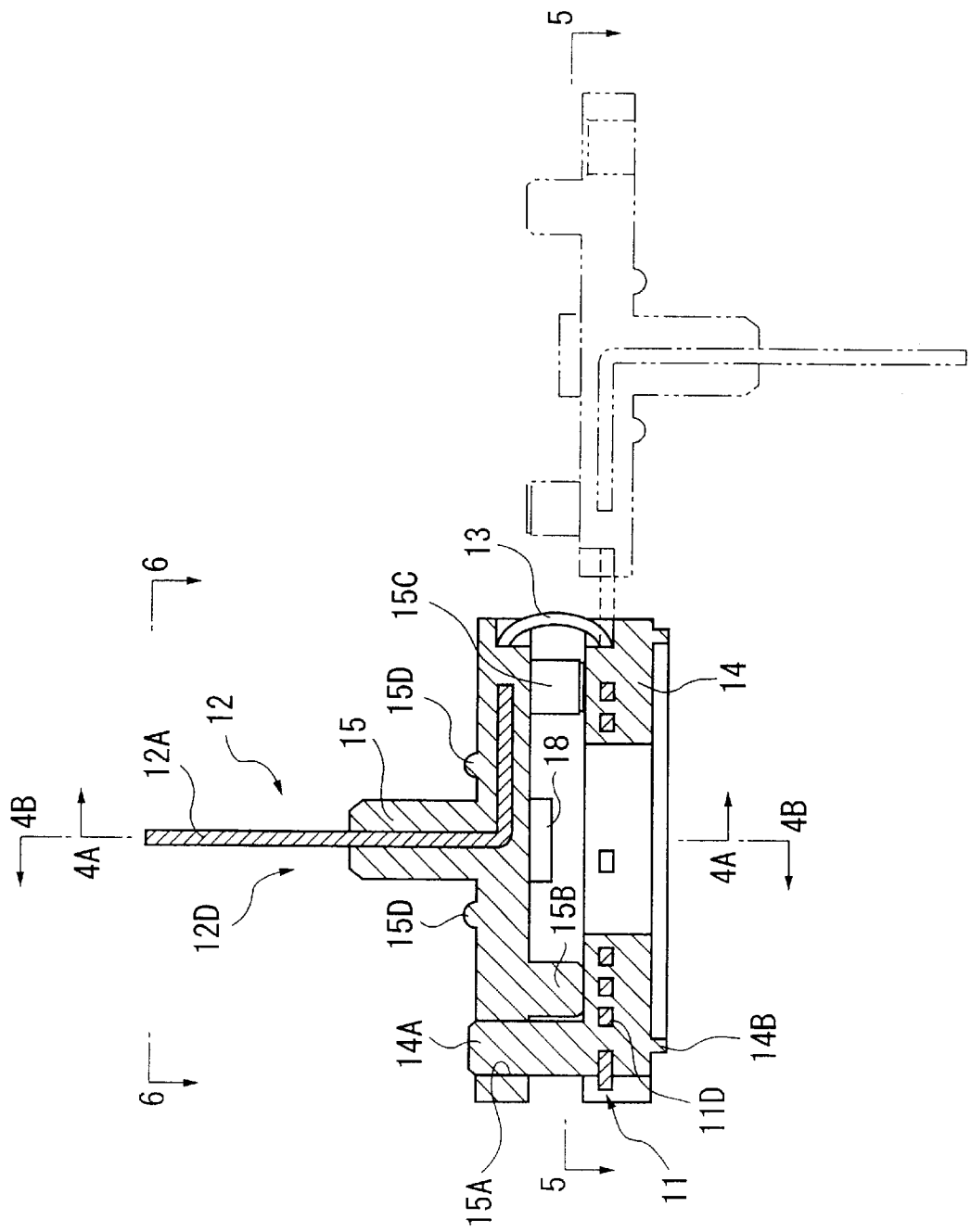

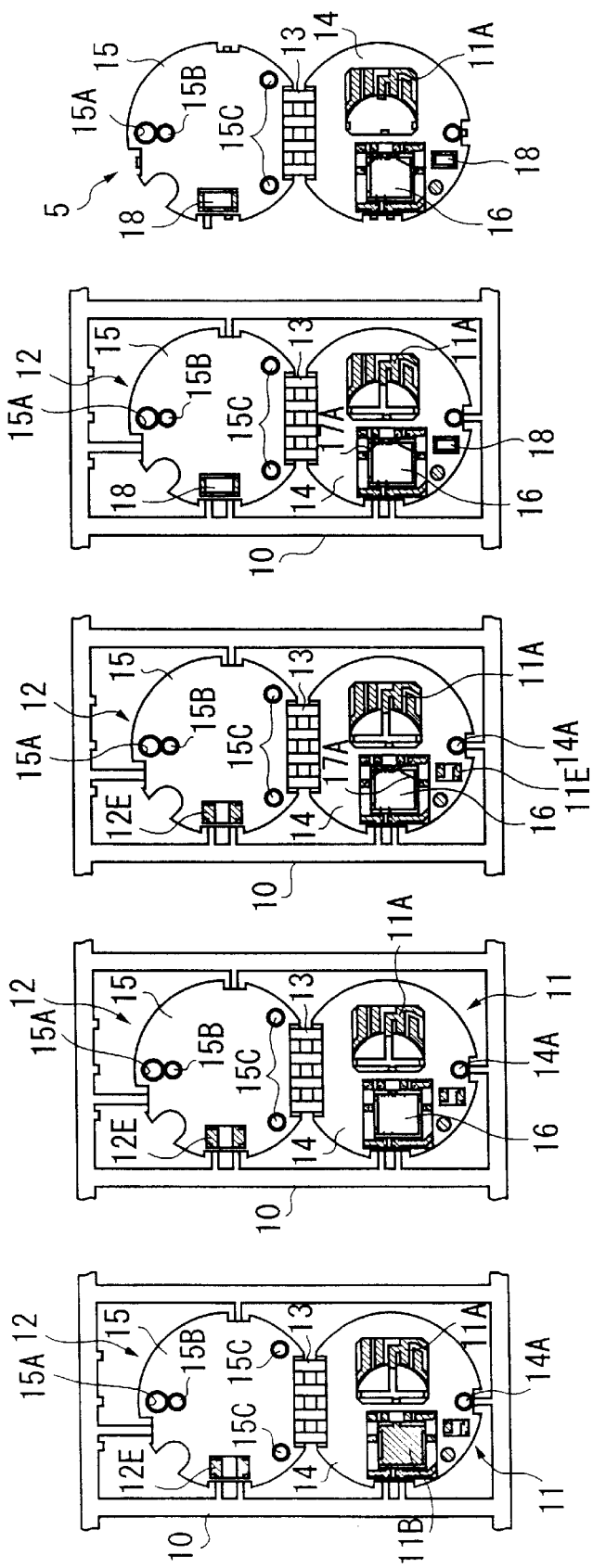

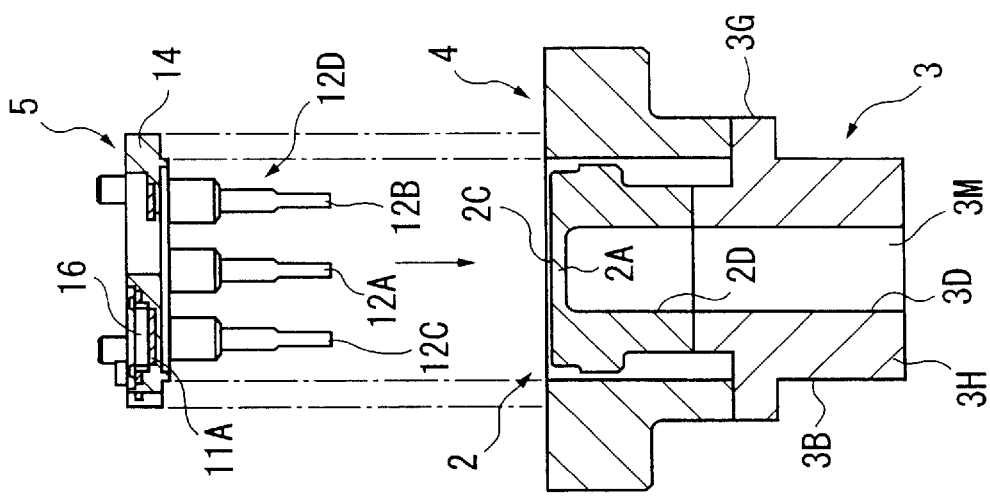
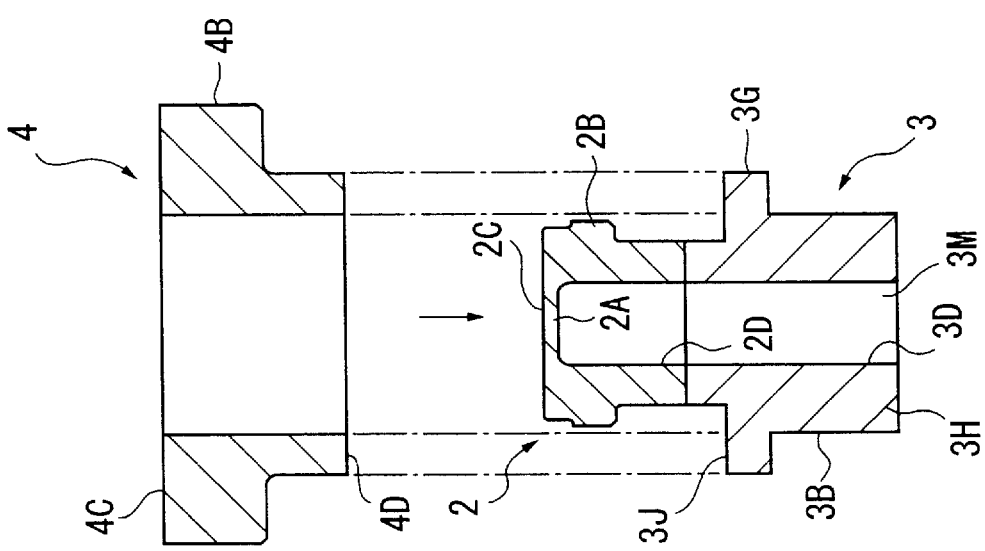
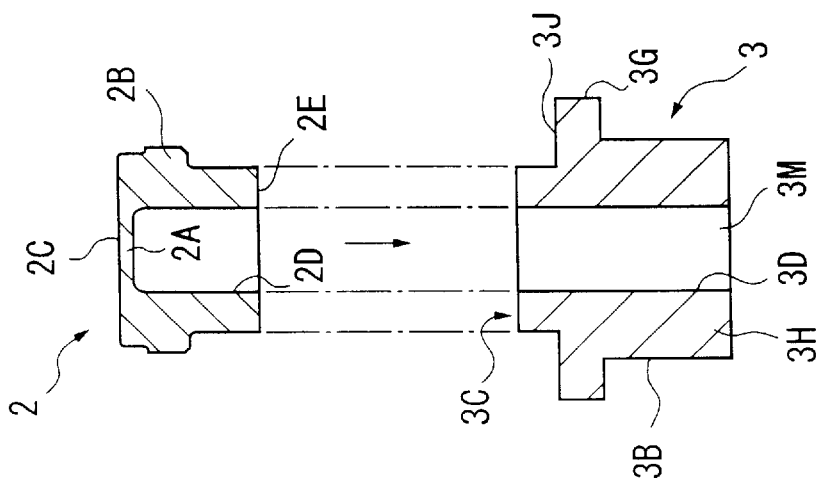

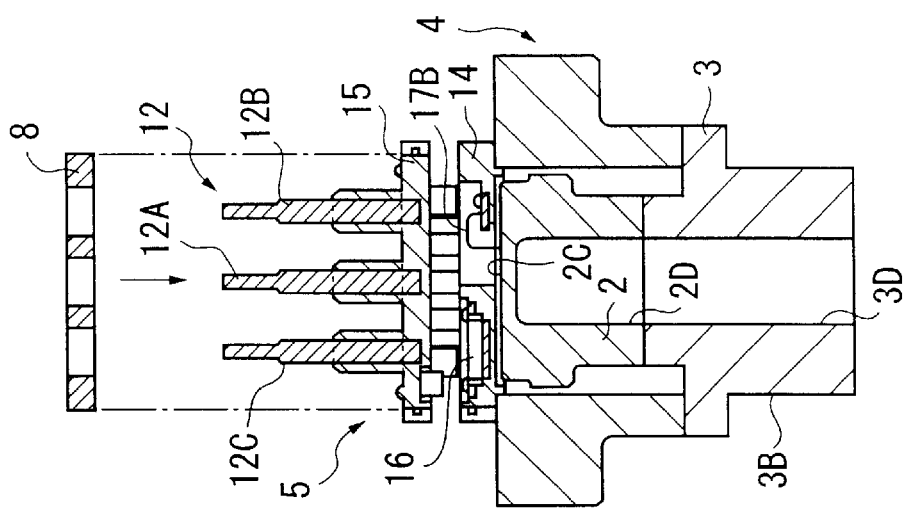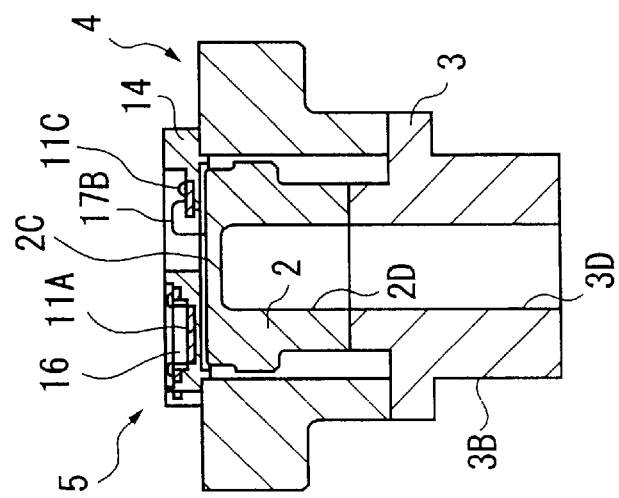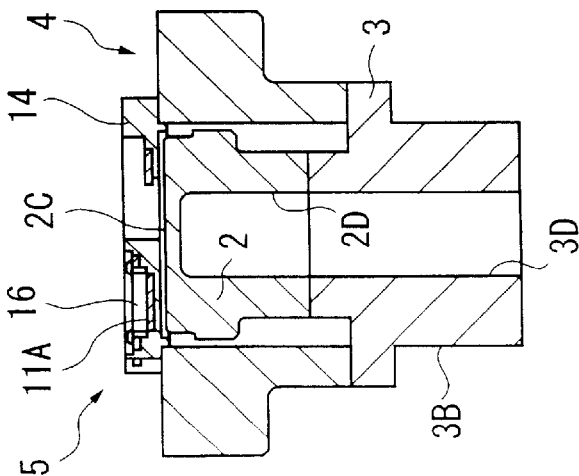

SENSOR INCLUDING A CIRCUIT LEAD FRAME AND A TERMINAL LEAD FRAME FORMED BY A METAL PLATE

BACKGROUND OF THE INVENTION

1. Field of the Invention

The present invention relates to a sensor used for measuring physical quantity etc., which is specifically used as a pressure sensor for converting fluid pressure into an electric signal to output to the outside.

2. Description of Related Art

Various sensors are used in measuring physical quantity etc. For instance, a pressure sensor which detects pressure and converts the pressure into an electric signal is used for measuring fluid pressure.

Such pressure sensor includes a joint clamped and fixed to a mount, a diaphragm attached to the joint by beam-welding etc., a pressure detecting element such as a strain gauge provided to the diaphragm, a circuit portion electrically connected to the pressure detecting element and a terminal for inputting and outputting the electric signal from the circuit portion, where the fluid pressure introduced to a pressure introducing port of the diaphragm is converted to strain of diaphragm, the strain being detected by the pressure detecting element. The diaphragm and the pressure detecting element are collectively referred to as a sensor module.

Conventional examples of pressure detecting sensor will be described below.

FIG. 16 shows a first conventional example of pressure sensor.

In FIG. 16, a sensor module 101 attached with a pressure detecting element 100 is provided to a joint 102. A cap-shaped housing 103 is attached to the joint 102 and a circuit portion 104 is accommodated within a space formed between the housing 103 and the joint 102.

In the first conventional example, the circuit portion 104 is composed of a printed circuit board 105 and electrical components 106 and terminal 107 respectively attached to the printed circuit board 105

The electrical components 106 are composed of IC chip and capacitor etc., which are installed on the printed circuit board 105 by soldering. The printed circuit board 105 and the pressure detecting element 100 of the sensor module 101 are electrically connected through the wiring 108 and the base 111. The terminal 107 is composed of an intermediate terminal 109 and an I/O terminal 110 connected to the intermediate terminal 109. An end of the intermediate terminal 109 is connected to the printed circuit board 105 by soldering etc.

FIG. 17 shows a second conventional example of pressure sensor.

In FIG. 17, the circuit portion 104 of the second conventional example is composed of a flexible circuit board 115, and electrical components 106 and terminal 107 respectively attached to the flexible circuit board 115.

The flexible circuit board 115 is electrically connected to the pressure detecting element 100 through the wiring 108. The terminal 107 has an end electrically connected to the flexible circuit board 115 by soldering etc and another end exposed to a connecting port 103A opening toward the outside of the housing 103.

FIG. 18 shows a third conventional example of pressure sensor.

In FIG. 18, the circuit portion 104 of the third conventional example is composed of a ceramic board 125 provided inside a housing 103, electrical components 106 and terminal 107 respectively attached to the ceramic circuit board 125.

The ceramic circuit board 125 is electrically connected to a pressure detecting element 100 through a wiring 108. The terminal 107 is composed of an intermediate terminal 109 and an I/O terminal 110 connected to the intermediate terminal 109. An end of the intermediate terminal 109 is connected to the ceramic circuit board 125 by soldering etc.

FIG. 19 and FIG. 20 show a fourth conventional example of pressure sensor.

In these figures, sensor module 101 of the fourth conventional example is attached to a joint 102 by beam welding etc. A substantially cylindrical housing 113 having partition thereinside is attached to the joint 102.

In the housing 113, a base 114 is attached to the joint 102 and a circuit board 135 is attached to the base 114. Further, a terminal 118 is attached to the base 114 through a terminal base 117.

FIG. 21 shows a fifth conventional example of pressure sensor. The fifth conventional example is disclosed in Japanese Patent Laid-Open Publication No. Hei11-237291.

In FIG. 21, a sensor module 201 of the fifth example is welded and fixed to a tapered butt weld portion 202A of the joint 202. A substantially cylindrical housing 203 is attached to a flange 202B of the joint 202 through a crimping portion 202C.

Inside the housing 203, a circuit board 205 is attached to the joint 202 through a case 204. Further, a terminal 207 is attached to the circuit board 205 through a terminal base 206. The circuit board 205 and the pressure detecting element of the sensor module 201 is electrically connected through a base 208.

In the fourth and the fifth conventional examples, the joint 102 and 202 are fixed by a screw to a mount, thereby also working as a flange as an attachment portion.

The sensor modules 101 and 201 are butted to the joints 102 and 202 to be welded.

The housings 113 and 203 are attached to the joints 102 and 202 through the crimping portions 102A and 202C.

In the pressure sensor of the above-described first conventional example, since the electrical components 106, the base 111 and the I/O terminal 110 have to be connected on the printed circuit board 105, so that the intermediate terminal 109 is required for escaping from the force applied to the I/O terminal 110.

Accordingly, in the first conventional example, the number of the components is increased to enlarge the size of the entire sensor and increasing number of connection between mutual components is required, thereby increasing production cost. Further, since such large number of connections between components is required, much cost is necessary for securing reliability of the connection process. Further, much process such as soldering is required for electrically connecting the board and the terminal, thereby increasing production cost of the pressure sensor.

In the pressure sensor of the second conventional example, since the terminal 107 is soldered to the flexible circuit board 115, production cost can be increased. Further, when the electrical components 106 and the terminal 107 are soldered to the flexible circuit board 115, the flexible circuit board 115 has to be guarded with a glass epoxy plate in order to improve rigidity thereof, thereby also increasing production cost.

In the pressure sensor of the third conventional example, since two types of terminal, i.e. the I/O terminal 110 and the intermediate terminal 109, are required as the terminal 107, the number of components are increased to enlarge the size of the entire sensor and increasing the production cost. Further, since the ceramic of high unit component price is used as the circuit board, the production cost is increased therefore.

On the other hand, the joints 102 and 202 of the pressure sensors of the fourth and the fifth conventional examples also work as the flange. In other words, the joints 102, 202 and the flange are integrally formed.

In the pressure sensor of the fourth conventional example, since the sensor module 101 is butted to the joint 102 to be welded, the bonding portion of the joint 102 is projected, thereby lengthening dimension of the entire pressure sensor.

On the other hand, in the pressure sensor of the fifth conventional example, since the sensor module 201 is welded and fixed in a manner that the sensor module 201 is buried to the tapered butt weld portion 202A of the joint 202, the problem of lengthening the dimension of the pressure sensor can be avoided. However, since the welding is conducted in an inclined direction or perpendicular direction, welding process such as alignment of weld line etc. is troublesome.

Further, in the pressure sensor of the fourth and fifth conventional examples, the circuit boards 135 and 205 and the terminals 118 and 207 are disposed on the sensor modules 101 and 201 in order to avoid enlargement of external diameter. Accordingly, the base 114 and the terminal base 117, the case 204, the base 208 and the terminal base 206 are required, thereby increasing the number of components and lengthening the entire length of the sensor.

SUMMARY OF THE INVENTION

An object of the present invention is to provide a sensor and a pressure sensor capable of reducing cost and size and improving reliability of the electrically-connected portions.

Accordingly, in the present invention, the circuit portion and the terminal of the sensor are formed by a lead frame and a resin mold is provided to a predetermined part of the lead frame.

Specifically, a sensor according to the present invention includes: a circuit portion attached with an IC die for amplifying an electric signal detected by a detecting element; and a terminal for inputting and outputting the electric signal from the circuit portion in which the circuit portion and the terminal have a lead frame formed of a metal plate, the metal plate being provided with a resin mold for electrically insulating the lead frame.

According to the present invention, since the lead frame of the circuit portion and the terminal is formed of a metal plate, the circuit portion and the terminal are electrically connected in advance. Accordingly, since it is not necessary to provide independent I/O terminal and intermediate terminal, the number of the components can be reduced, so that the reduction in production cost in accordance with component cost reduction and the size of the entire sensor can be obtained.

Further, the process for connecting the circuit portion and the terminal by soldering etc. is not required, thereby improving reliability for inexpensively connecting the component.

Further, even when a lead frame of complicated shape is used, the shape can be held by the resin mold and insulation can be securely maintained, so that the circuit portion can work appropriately.

In the above, the resin mold may preferably include a circuit-side resin mold provided to the circuit portion and a terminal-side resin mold provided to the terminal.

According to the arrangement, since the circuit portion and the terminal have the metal plate lead frame, the lead frame connecting the circuit portion and the terminal can bent in any manner and the circuit portion and the terminal can be opposed, so that the size of the entire sensor can be reduced.

The sensor may preferably have a conductive case covering the circuit portion.

According to the above arrangement, the conductive case can shield the electromagnetic wave from the outside, so that the influence such as noise on the circuit portion by the outside electromagnetic wave can be avoided.

The terminal-side resin mold may preferably penetrate the conductive case.

In the above arrangement, since the terminal is insulated against the conductive case by the terminal-side resin mold, electricity does not run from the terminal to the conductive case on account of short circuit, thereby improving reliability. Further, since independent insulation component between the terminal and the conductive case is not necessary, the number of components can be reduced.

A gasket may preferably be interposed between the conductive case and the terminal-side resin mold, and a projection may preferably be formed on a part of the terminal-side resin mold facing the gasket.

According to the above arrangement, air sealability can be obtained by sealing the space between the components with the gasket. Accordingly, invasion of dust and humidity into the conductive case can be avoided. Further, since the projection is formed on the terminal-side resin mold, the gasket can be pressed to the conductive case by the projection, thereby enhancing sealing effect.

Further, the circuit-side resin mold and the terminal-side resin mold may preferably be mutually opposed by bending the lead frame, and a positioning projection may preferably be provided to at least one of the circuit-side resin mold and the terminal-side resin mold for determining the position of the circuit-side resin mold and the terminal-side resin mold.

According to the above arrangement, when the circuit-side resin mold and the terminal-side resin mold are bent to be mounted at a predetermined position, the mutual position thereof can be defined by the positioning projections, so that the assembly work of the sensor can be simplified.

Further, at least one of the circuit portion and the terminal may preferably have a SMT (Surface Mount Technoloy) pad for attaching electrical components to the lead frame.

According to the above arrangement, protection circuit etc. can be formed by attaching the electrical components to the SMT pad of the lead frame, thereby improving function and reliability of the sensor.

Further, the lead frame may preferably have a projection abutted to the conductive case.

According to the above arrangement, since the projection works as a ground terminal, resistance against noise can be improved.

Further, a pad for attaching a wiring for connecting the detecting element and the circuit portion may preferably be provided to the lead frame of the circuit portion.

According to the above arrangement, since independent base for connecting the wiring is not necessary, the number of components can be reduced, so that the reduction in production cost in accordance with component cost reduction and entire size of the sensor is possible.

The lead frame may preferably be bent so that the pad for attaching the wiring is located closer to the detecting element relative to the other part of the lead frame.

According to the above arrangement, when the circuit portion and the detecting element are wired by wire-bonding, the length of the wiring to be bonded can be shortened. Therefore, workability can be improved, the possibility of short circuit between the wiring and the circuit portion can be reduced and the reliability of the pressure sensor against vibration can be improved.

Further, the terminal may preferably have an input terminal, an output terminal and a common terminal.

According to the above arrangement, since the I/O terminals are formed of the lead frames, the terminal can be directly soldered on a printed circuit board.

The above sensor may preferably be a pressure sensor. In other words, the sensor of the present invention may preferably be used for detecting pressure.

According to thus arranged present invention, an inexpensive small pressure sensor having high reliability for connecting the components can be provided.

Another object of the present invention is to provide a pressure sensor capable of reducing length and facilitating production thereof.

For the object, in the present invention, the joint and the flange, which are conventionally integrated are independently formed.

Specifically, in a pressure sensor according to the present invention, the detecting element is for detecting pressure, the sensor further including: a joint attached with the detecting element and having a pressure introducing port thereinside; a flange for fixing the joint to a mount; and a case for accommodating the circuit board except for a part thereof, the case being attached to the flange, the flange being disposed so that an inner wall thereof faces the detecting element, the joint and the flange being independently formed.

According to the above arrangement, the detecting element is welded while being butted to the joint and the flange is welded to the joint. Further, the circuit board is provided on the flange to construct the pressure sensor.

Since the flange is not welded in welding the joint to the detecting element, the flange does not interfere in the welding process. Accordingly, it is not necessary to conduct welding in an unnatural direction, e.g. inclined and perpendicular direction, so that alignment of weld line etc. can be easily conducted, thereby easily producing the pressure sensor.

Since the detecting element is sunk inside the flange when the flange is attached to the joint to which the detecting element is welded, the length of the pressure sensor itself can be shortened.

Since the circuit board is attached to the flange, component such as spacer and terminal base is not required in mounting the circuit board. Accordingly, the number of the components can be reduced and the steps for assembling the components can be reduced, thereby facilitating the production of the pressure sensor.

Since the lead frame of the circuit portion and the terminal is formed of a metal plate, the circuit portion and the terminal are electrically connected in advance, so that the step for connecting the circuit portion and the terminal by soldering etc. is not required, thereby simplifying the assembly process of the sensor. Further, since intermediate terminal for connecting with the circuit portion is not required on the terminal, the number of components can be reduced and the assembly process of the sensor can be further simplified and production of the pressure sensor can be facilitated.

Further, since the case is provided to the pressure sensor, dustproof effect can be obtained. Since the case is attached to the flange by welding etc., the production of pressure sensor can be further facilitated.

In the present invention, the case may preferably be electrically conductive.

According to the above arrangement, since the conductive case can shield the electromagnetic wave from the outside, the influence such as noise on the circuit board by the outside electromagnetic wave can be avoided.

BRIEF DESCRIPTION OF THE DRAWINGS

FIG. 3 is a cross section of a circuit board of the first embodiment;

FIGS. 10(A) to 10(E) are illustrations for explaining respective steps in manufacturing the circuit board in the first embodiment;

FIGS. 11(A) to 11(H) are illustrations for explaining respective steps in manufacturing the pressure sensor in the first embodiment;

DETAILED DESCRIPTION OF PREFERRED EMBODIMENT(S)

Preferred embodiments of the present invention will be described below with reference to attached drawings.

[First Embodiment]

Figure 1A:
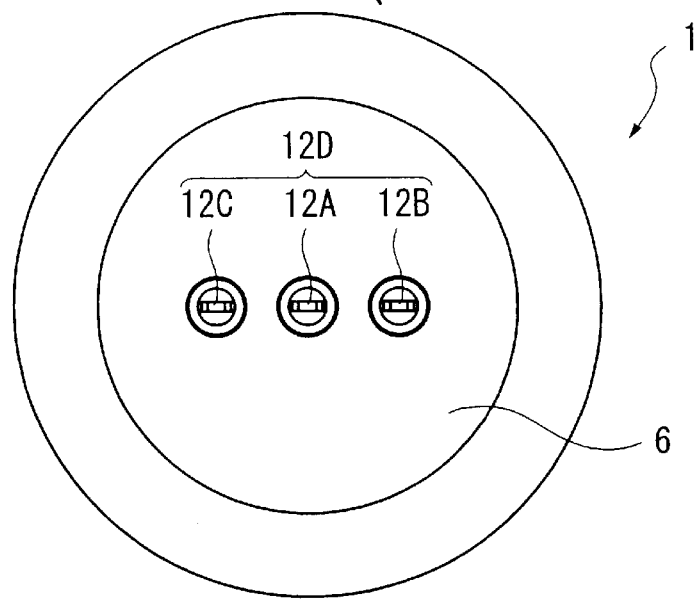
FIG. 1(A) is a plan view showing a pressure sensor according to first embodiment of the present invention.
Figure 1B:
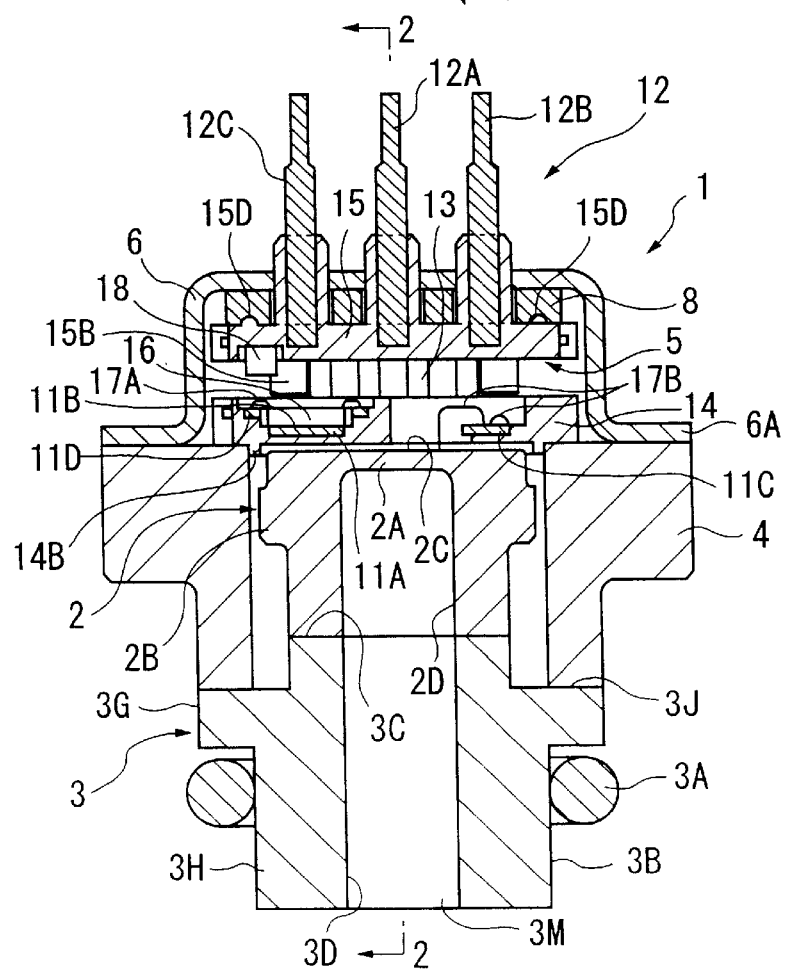
FIG. 1(B) is a cross section thereof.

FIG. 1(A) is a plan view showing a pressure sensor 1 according to first embodiment, and FIG. 1(B) is a cross section thereof. The pressure sensor 1 is installed on a vehicle for detecting hydraulic pressure, which is also applied for various machineries such as ship, construction heavy equipment and refrigerator and can be used for detecting pressure of any fluid such as air pressure and water pressure.

In FIG. 1, the pressure sensor 1 has a sensor module 2 as a detecting element, a substantially cylindrical joint 3 with the sensor module 2 being attached to a core thereof, a flange 4 provided on an end surface of the joint 3, a circuit board 5 and a conductive case 6 respectively provided on the flange 4, and a gasket 8 provided between the circuit board 5 and the conductive case 6.

The sensor module 2 is a substantially cylindrical metal component having a diaphragm 2A as a detector at an end thereof and a support base 2B on a circumference thereof as shown in FIG. 11(A).

The metal component is made of metal of excellent mechanical strength, corrosion resistance and spring properties (elasticity) such as precipitation hardening stainless steel SUS630 and 17-4PH.

The diaphragm 2A has a circular surface on which a pressure detecting element constituting a bridge circuit is provided. The pressure detecting element 2C is composed of a strain gauge through an insulation layer such as silicon oxide, which outputs electric signal corresponding to deformation of the diaphragm 2A when the diaphragm 2A is deformed in response to pressure.

An inner wall 2D of the sensor module 2 is an introduction port for introducing detected pressure to a backside of the diaphragm 2A.

The joint 3 is attached to a portion to be detected such as tank and piping as shown in FIG. 11(A), which is composed of a substantially cylindrical metal member.

Different material is used for the metal member in accordance with fluid pressure range. Specifically, ferrite or austenite stainless steel (such as SUS430 and SUS 304) is used in low/mid pressure range (e.g. less than 100 MPa) and precipitation hardening stainless steel (such as SUS630 and 17-4PH) is used in high-pressure range (e.g. more than 100 MPa).

The joint 3 has a cylindrical body 3H, an end of which is a butt weld portion 3C to be bonded to the sensor module 2.

An inner wall 3D of the body 3H is a pressure introducing port 3M. The inner wall 2D of the sensor module 2 is connected with the inner wall 3D of the body 3H when being bonded to the sensor module 2. When the pressure to be detected is introduced to the pressure introducing port 3M of the body 3H from a side opposite to the sensor module 2, the pressure reaches to the sensor module 2 to be measured.

A brim 3G continuously extending on the entire circumference of the body 3H is provided around the butt weld portion 3C. A side of the brim 3G on the side of the butt weld portion 3C is a butt weld surface 3J through which the body 3H is bonded to the flange 4.

A circumference of the body 3H from the brim 3G to the end opposite to the butt weld portion 3C is a fitting surface 3B to be attached to the object of which pressure is detected. A sealing O-ring 3A is attached to the fitting surface 3B.

As shown in FIG. 11(B), the flange 4 is a substantially cylindrical metal member.

The flange 4 has a fixing surface 4B for fixing the joint to a mount on outer circumference thereof, an attachment surface 4C for the circuit board 5 and the case 6 to be attached on an end surface thereof and a butt weld surface 4D to be bonded to the butt weld surface 3J of the joint 3 on the other end surface thereof.

Stainless steel is preferably used as the material of the flange 4, however, general steel may be used as long as welding property, strength and corrosion resistance can be satisfied.

Specific arrangement of the circuit board 5 is shown in FIG. 2 to FIG. 6.

Figure 2:
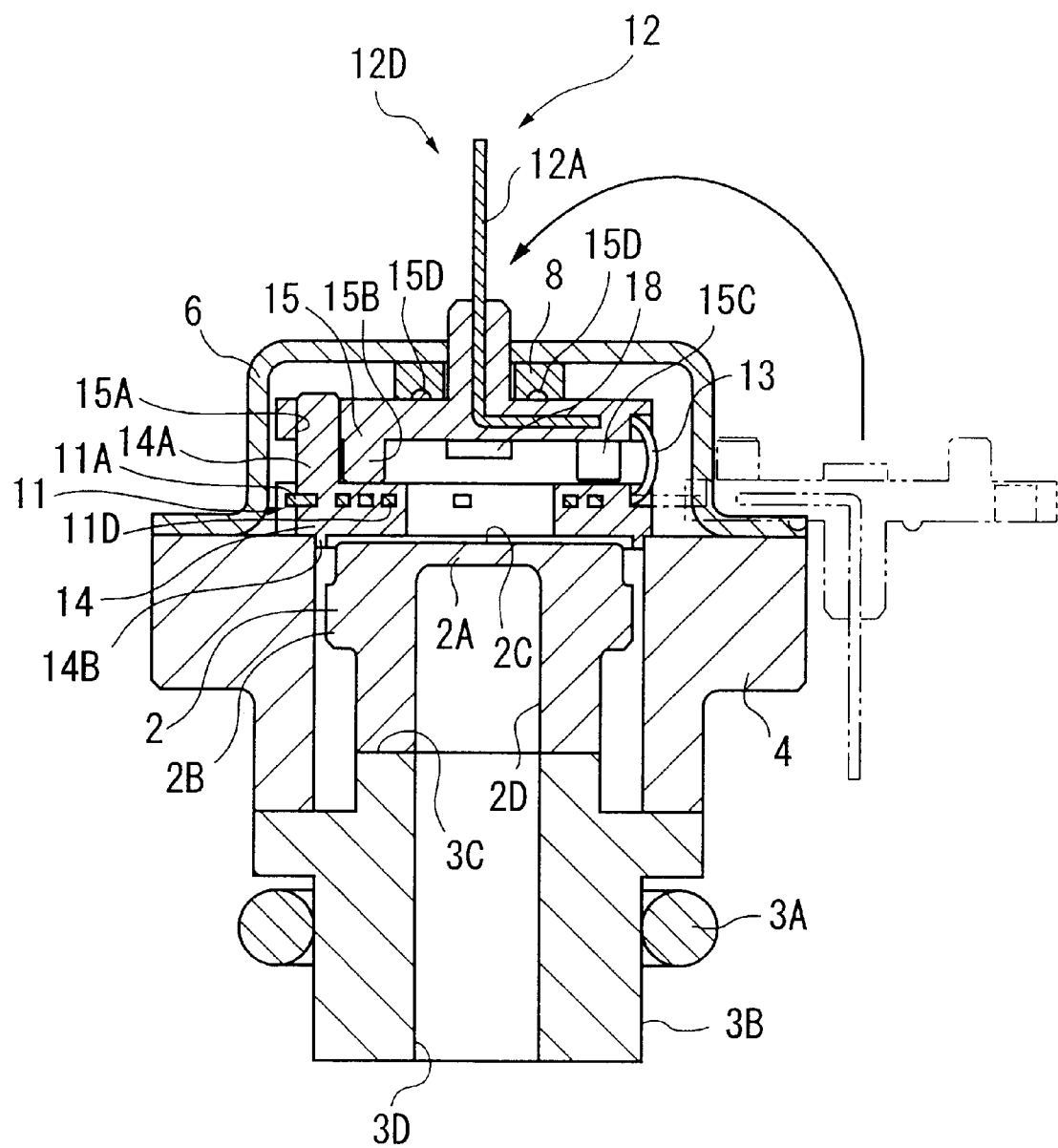
FIG. 2 is a cross section taken along 2—2 line of FIG. 1 seen in the arrowed direction.
Figure 4A:
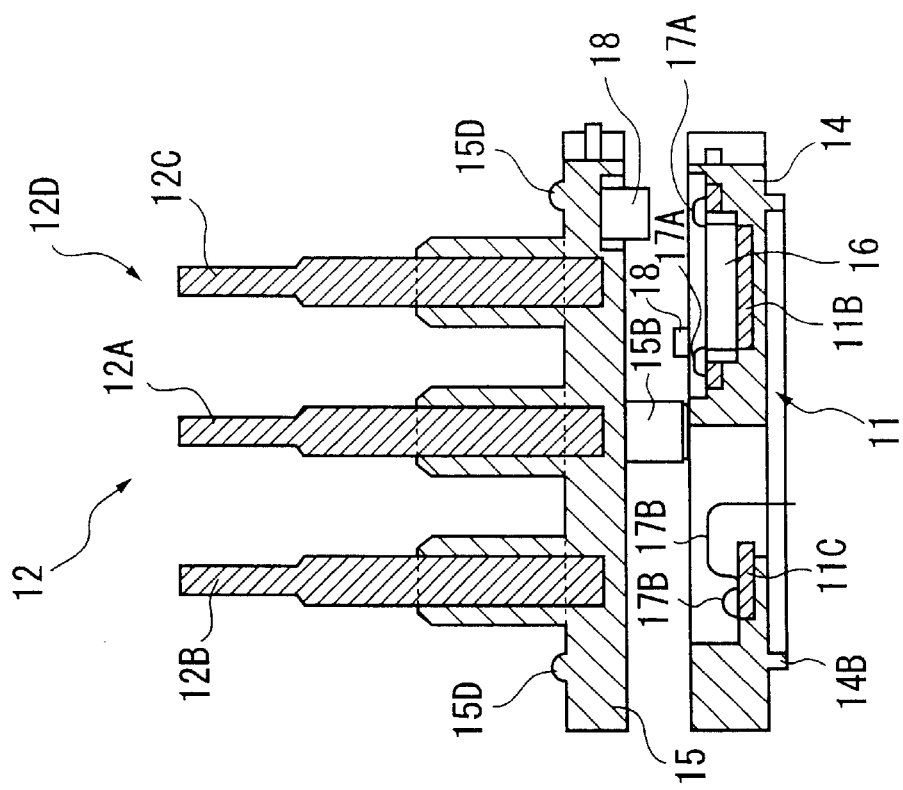
FIG. 4(A) is a cross section of FIG. 3 taken along 4(A)—4(A) line seen in the arrowed direction.
Figure 4B:
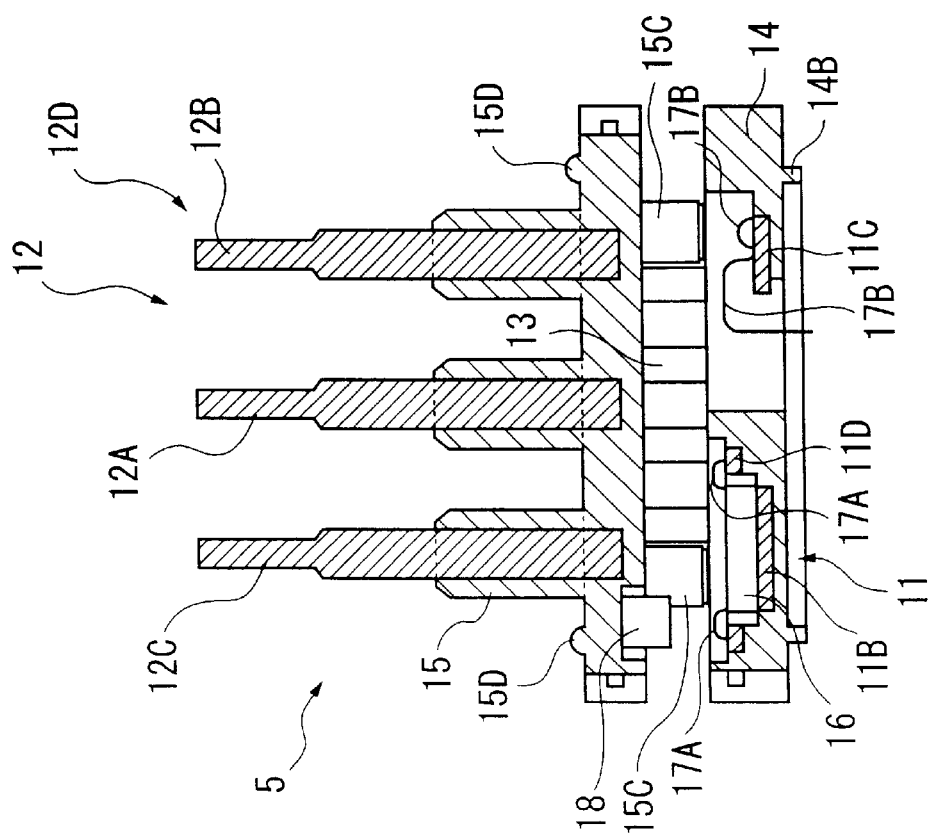
FIG. 4(B) is another cross section of FIG. 3 taken along 4(B)—4(B) line seen in the arrowed direction.
Figure 5:
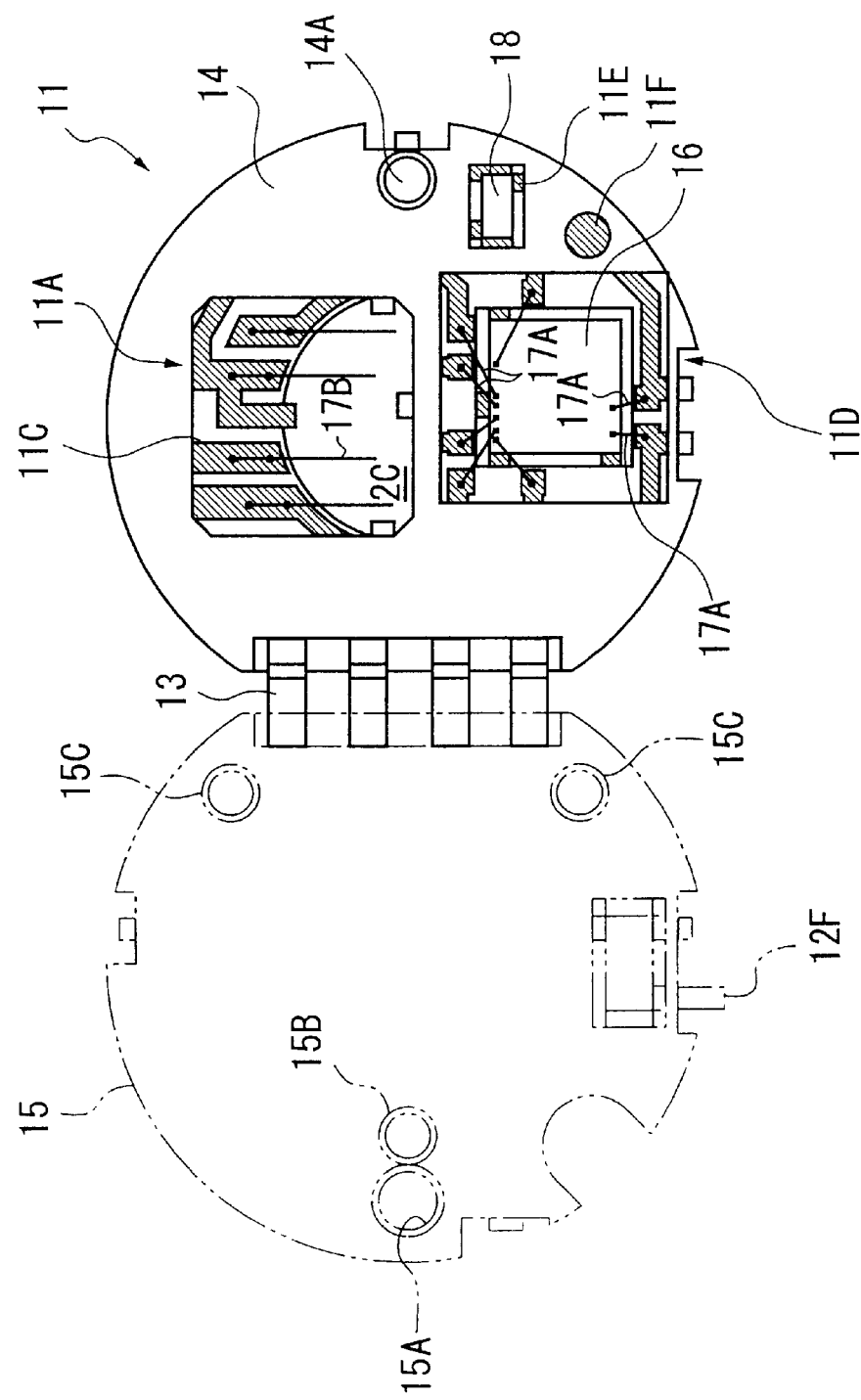
FIG. 5 is a view seen along 5—5 line of FIG. 3 in the arrowed direction.
Figure 6:
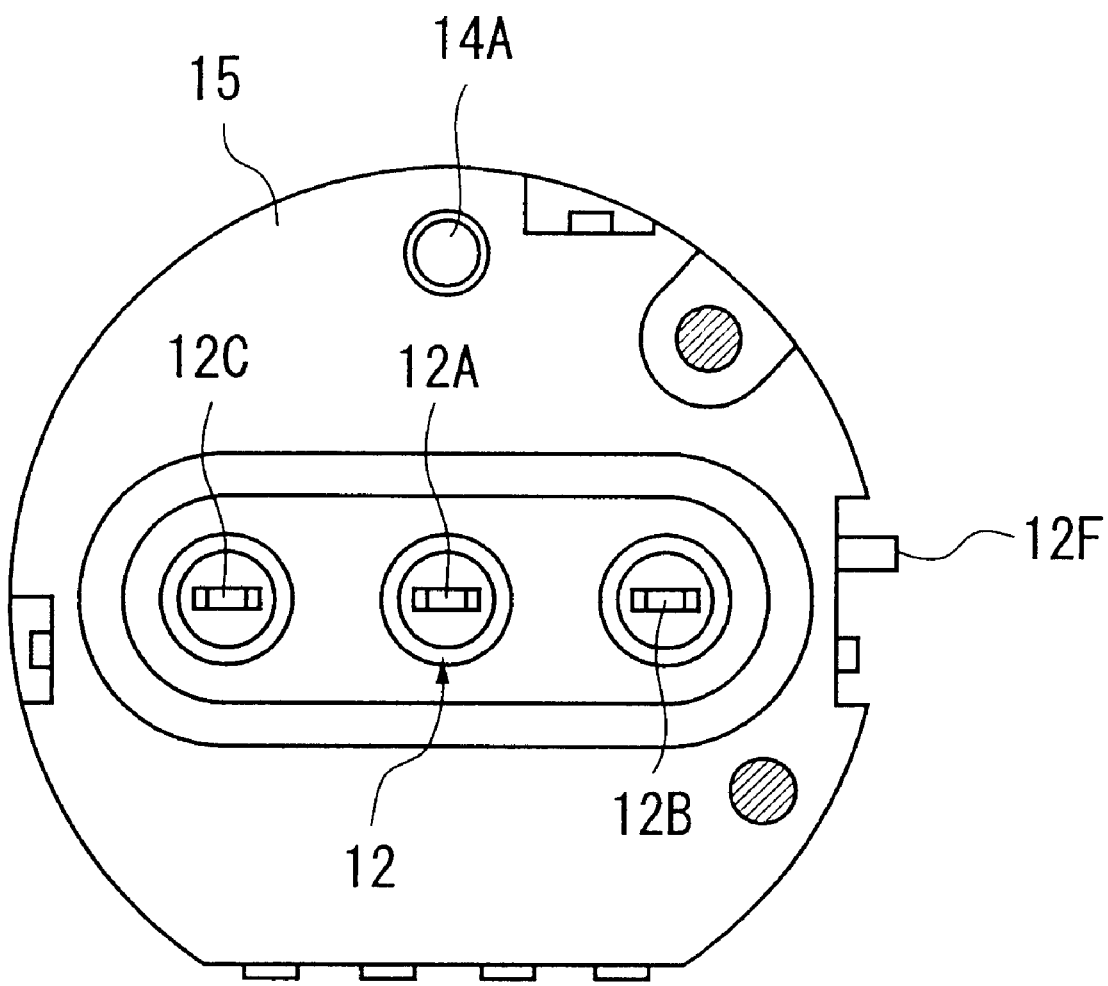
FIG. 6 is a view seen along 6—6 line of FIG. 3 in the arrowed direction.

FIG. 2 is a cross section taken along 2—2 line in FIG. 1(B) seen in the arrowed direction, FIG. 3 is a cross section of the circuit board 5, FIG. 4(A) is a cross section taken along 4(A)—4(A) line in FIG. 3, FIG. 4(B) is a cross section taken along 4(B)—4(B) line in FIG. 3, FIG. 5 is a view seen along 5—5 line in FIG. 3, and FIG. 6 is a view seen along 6—6 line in FIG. 3 in the arrowed direction.

In these figures, the circuit board 5 includes a circuit portion 11 having one side facing the diaphragm 2A, a terminal 12 for inputting/outputting the electric signal from the circuit portion 11 and a connector lead frame 13 for connecting the circuit portion 11 and the terminal 12.

The circuit portion 11 has a circuit lead frame 11A and a circuit-side resin mold 14 provided on the circuit lead frame 11A.

The terminal 12 has a terminal lead frame 12D and a terminal-side resin mold 15 provided on the terminal lead frame 12D.

The circuit lead frame 11A, the terminal lead frame 12D and the connector lead frame 13 are integrated in a continuous pattern, which is bent at the connector lead frame 13 so that the circuit portion 11 and the terminal portion 12 are opposed. Incidentally, in FIG. 5, the circuit lead frame 11A of the circuit portion 11 is shown in hatching.

The circuit lead frame 11A has a circuit body 11D, a die bonding pad 11B for an IC die 16 to be attached, a terminal 11C to be electrically connected with the pressure detecting element 2C, a SMT (Surface Mount Technology) pad 11E for the electrical components 18 to be mounted, and a probing pad 1 IF, the die bonding pad 11B and the terminal 11C being bent to be close to the pressure detecting element 2C relative to the circuit body 11D.

The circuit body 11D and the IC die 16 are connected through a wiring 17A by wire bonding. The terminal 11C and the pressure detecting element 2C are connected through a wiring 17B by wire bonding.

The circuit-side resin mold 14 is for holding the circuit lead frame 11A and for electrical insulation, which includes a positioning projection 14A and an engaging ring 14B to be engaged to the inner wall of the flange 4.

The terminal lead frame 12D has an input terminal lead 12A, an output terminal 12B and a common terminal 12C, a SMT pad 12E for the electrical components 18 to be mounted, a probing pad 12G and a ground terminal 12F. The ground terminal lead 12F abuts to the conductive case 6.

The terminal-side resin mold 15 is for holding the terminal lead frame 12D and for electrical insulation, which includes an engaging hole 15A for the positioning projection 14A to be inserted, a positioning projection 15B located adjacent to the engaging hole 15A, a positioning projection 15C located adjacent to the connector lead frame 13 away from the positioning projection 15B and a sealing projection 15D having no parting line. The distal ends of the positioning projections 15B and 15C abut to a plane of circuit-side resin mold 14.

In FIG. 1 and FIG. 2, the case 6 accommodates the circuit board 5 except for a part of the terminal 12 and is formed by a conductive material such as stainless and general steel.

The case 6 has a cap-shaped shell 6B covering the circuit board 5 and a brim 6A integrally formed around the periphery of the shell 6B.

A through hole 6C for the terminal 12 to be penetrated is formed at the center of the shell 6B.

A part of the brim 6A to be bonded to the flange 4 is made flat. The external diameter of the brim 6A is substantially the same as the external diameter of the flange 4.

The gasket 8 is interposed between the conductive case 6 and the terminal-side resin mold 15, which are pressed to the conductive case 6 by the sealing projection 15D of the terminal-side resin mold 15.

Figure 7:
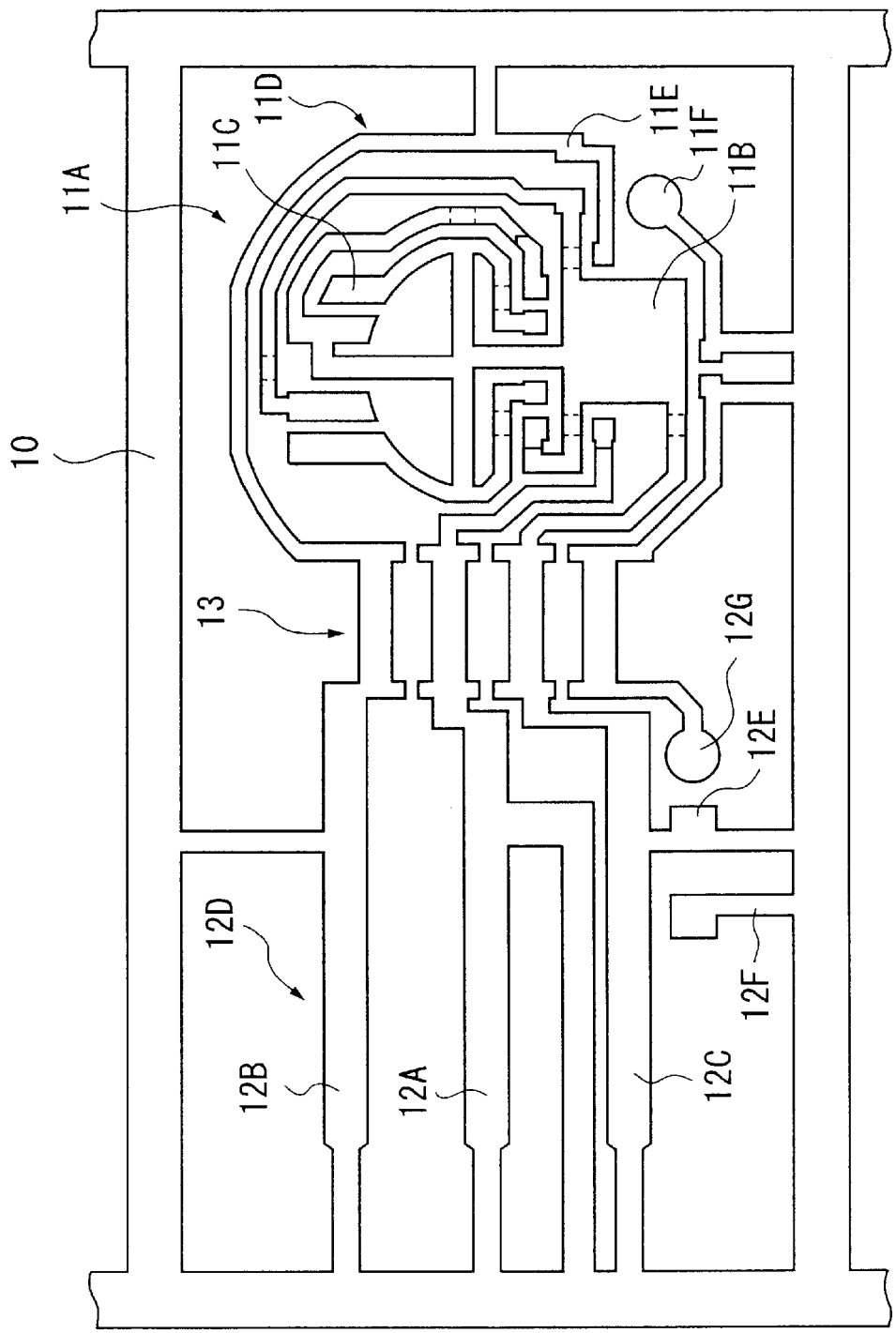
FIG. 7 is a plan view showing a metal plate of the first embodiment formed with a circuit lead frame, a terminal lead frame and a connector lead frame.
Figure 8:
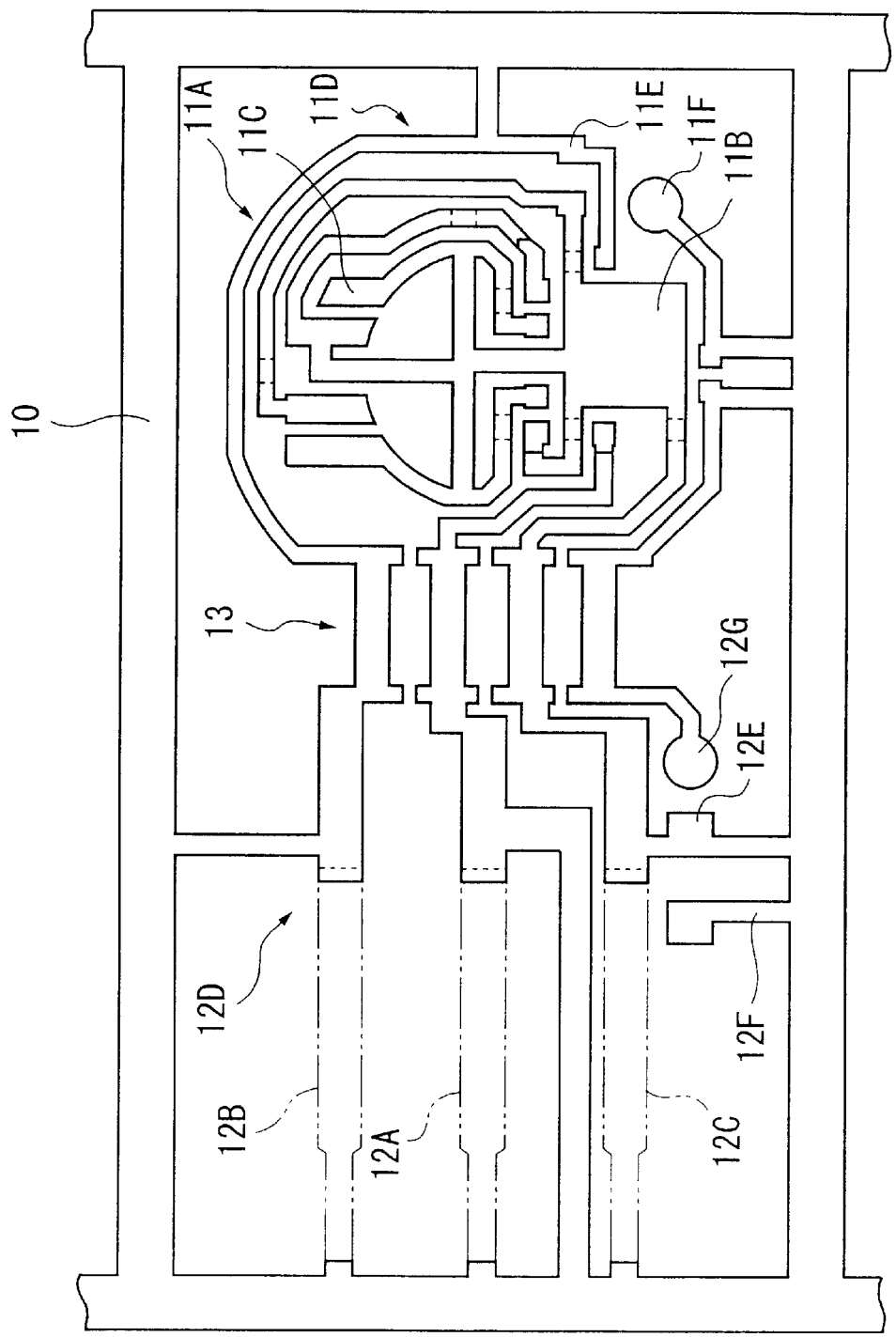
FIG. 8 is a plan view showing the terminal lead frame of the metal plate of FIG. 7 being bent.
Figure 9:
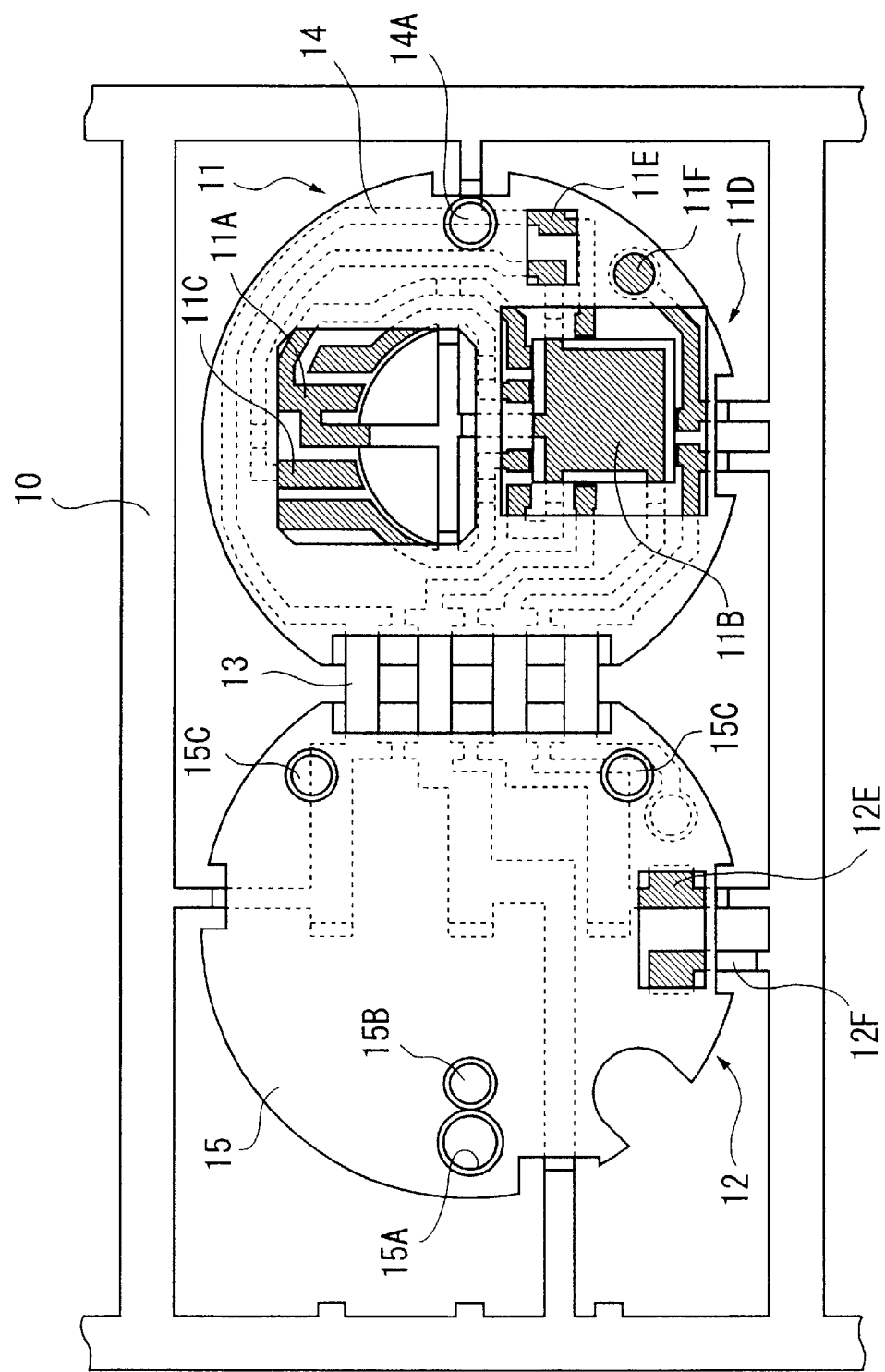
FIG. 9 is a plan view showing the metal plate of the first embodiment provided with a resin mold.

As shown in FIG. 7, the circuit lead frame 11A, the terminal lead frame 12D and the connector lead frame 13 are made of flexible metal plate 10. A predetermined portion of the metal plate 10 is bent (see FIG. 8) and the circuit-side resin mold 14 and the terminal-side resin mold 15 are provided in this state (see FIG. 9).

Next, a producing method of the pressure sensor 1 according to first embodiment will be described below with reference to FIGS. 10 to 11.

Initially, production of circuit board 5 will be described below with reference to FIG. 10.

First, pattern forming step is conducted. In the step, the circuit lead frame 11A, the terminal lead frame 12D and the connector lead frame 13 having predetermined pattern are formed on the metal plate 10 by etching or press (see FIG. 7). The thickness of the metal plate 10 can be selected from 0.1 mm to 1 mm as desired. 0.25 mm thickness may preferably be used. With the thickness, the terminal can be directly soldered on a substrate and easily bent.

Subsequently, as shown in FIG. 10(A), mold step is conducted. In the step, a circuit-side resin mold 14 and the terminal-side resin mold 15 for holding the respective lead frames are attached to the metal plate 10.

At this time, the resin molds 14 and 15 are provided on both sides of the metal plate 10. Thermosetting epoxy resin or thermoplastic PBT, PPS resin may be used for the material of the molds.

Further, the IC die 16 is die-bonded to the die bonding pad 11B of the circuit lead frame 11A as shown in FIG. 10(B) and the IC die 16 and the circuit body 11D are wire-bonded to provide the wiring 17A.

Thereafter, as shown in FIG. 10(D), silicon gel is coated on the IC die 16 for protecting the IC die 16 and the electrical components 18 are mounted on the SMT pads 11E and 12E. Further, unnecessary parts of the metal plate 10 is cut and removed as shown in FIG. 10(E), thereby producing the circuit board 5.

Assembling method of the pressure sensor 1 using thus produced circuit board 5 will be described below with reference to FIG. 11.

Initially, the pressure detecting element 2C is provided on the diaphragm 2A to form the sensor module 2 (sensor module forming step), and the sensor module 2 is welded on the joint 3 by electron beam welding as shown in FIG. 11(A).

Then, as shown in FIG. 11(B), the flange 4 is projection-welded to the joint 3.

Subsequently, as shown in FIG. 11(C), the circuit board 5 manufactured by the circuit board producing step is adhered on the end surface of the flange 4 by an adhesive of epoxy etc. (board attaching step). The adhered condition is shown in FIG. 11(D).

Further, as shown in FIG. 11(E), the pressure detecting element provided to the sensor module 2 and the terminal 11C of the circuit lead frame 11A are connected by wire-bonding to form the wiring 17B (wiring step).

Thereafter, as shown in FIG. 11(F), the terminal lead frame 12D is bent to form right angle relative to the circuit portion 11 with the connector lead frame 13 as a bending center (bending step), and the gasket 8 is attached to the terminal 12.

Figure 11G:
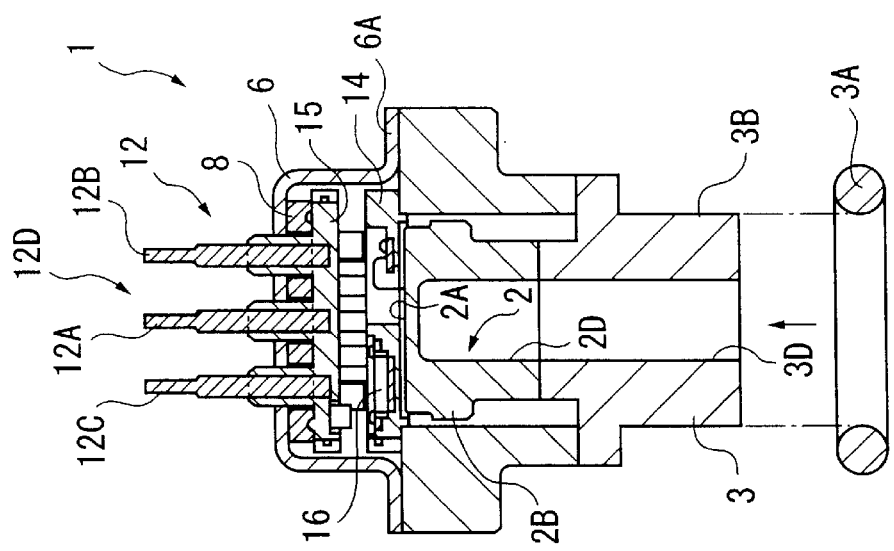

Further, as shown in FIG. 11(G), the circuit portion 11 etc. is covered by the conductive case 6 so that a part of the terminal 12 is exposed to the outside and the conductive case 6 is welded to the end surface of the flange 4. At this time, projection welding is conducted on the entire periphery of the brim 6A.

Figure 11H:
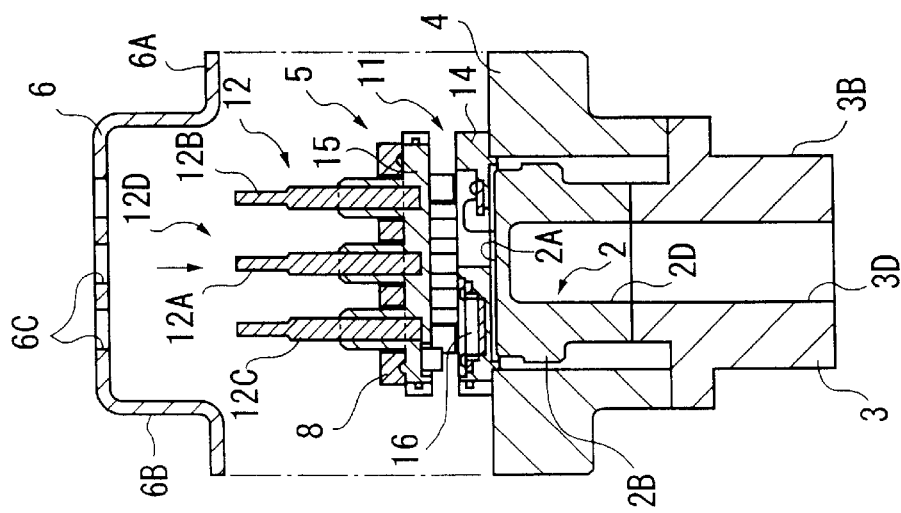

Further, as shown in FIG. 11(H), the O-ring 3A is attached to the attachment surface 3B of the joint 3.

The pressure sensor 1 can be constructed by the above steps, which is attached to a tank and piping etc. (not shown).

According to the above-described first embodiment, following advantages can be obtained.

1) Since the circuit portion 11 for amplifying the electric signal detected by the pressure detecting element 2C, the terminal 12 for inputting/outputting the electric signal from the circuit portion 11, and the circuit board 5 having the connector lead frame 13 for connecting the circuit portion 11 and the terminal 12 are provided, the circuit portion 11 and the terminal 12 having the lead frame 11A, 12D and 13 formed of the metal plate 10, the metal plate 10 having the resin molds 14 and 15 for holding the lead frames 11A and 12D and for electric insulation, the lead frame 11A of the circuit portion 11 and the lead frame 12D of the terminal 12 are electrically connected and there is no need for independently providing I/O terminal and intermediate terminal. Accordingly, the number of components can be decreased and reduction in the production cost in accordance with component cost reduction and the entire size of the sensor is possible.

Further, since the work for connecting the circuit portion 11 and the terminal 12 by soldering etc. is unnecessary, reliability for connecting components can be improved with low cost.

Further, even when lead frames 11A and 12D of complicated shape are provided, the shape can be securely held by the resin molds 14 and 15 and insulation can be maintained, malfunction of the circuit portion 11 and the terminal 12 can be avoided.

2) Since the resin mold includes the circuit-side resin mold 14 provided to the circuit portion 11 and the terminal-side resin mold 15 provided to the terminal 12, the circuit portion 11 and the terminal 12 having the lead frame of the metal plate 10, the lead frame connecting the circuit portion 11 and the terminal 12 can be bent so that the circuit portion 11 and the terminal 12 can be opposingly disposed, thereby reducing the entire size of the sensor.

3) Since the circuit portion 11 has the die pad 11B for attaching the IC die 16, the process for attaching the IC die 16 to the lead frame 11A can be facilitated.

4) Since the pressure sensor 1 has the conductive case 6 for covering the circuit portion 11, the conductive case 6 can shield the electromagnetic wave from the outside, so that the influence such as noise on the circuit portion 11 by the outside electromagnetic wave can be avoided.

5) Since the terminal-side resin mold 15 penetrates the conductive case 6, the terminal 12 is insulated against the conductive case 6 by the terminal-side resin mold 15, so that electricity does not run from the terminal 12 to the conductive case 6 on account of short circuit. Further, since the independent member for insulation between the terminal 12 and the conductive case 6 is not necessary, the number of components can be reduced.

6) Since the gasket 8 is interposed between the conductive case 6 and the terminal-side resin mold 15, air sealability can be obtained by sealing the space between the components. Accordingly, invasion of dust and humidity into the conductive case 6 can be prevented.

7) Since the sealing projection 15D is formed at a portion of the terminal-side resin mold 15 opposing the gasket 8, the gasket 8 can be pressed to the conductive case 6 by the projection 15D, thereby enhancing sealing effect.

8) Since the circuit-side resin mold 14 and the terminal-side resin mold 15 are bent to be opposed and the positioning projections 14A, 15B and 15C for determining position between the circuit-side resin mold 14 and the terminal-side resin mold 15 are provided on both of the circuit-side resin mold 14 and the terminal-side resin mold 15, in setting the attitude of the circuit-side resin mold 14 and the terminal-side resin mold 15, the mutual position can be defined by the positioning projections 14A, 15B and 15C, so that the assembly work of the sensor can be simplified and production cost can be reduced.

9) Since the circuit lead frame 11A has the circuit body 11D and the terminal 11C for attaching the wiring 17B, independent base for connecting the wiring 17B is not necessary. Accordingly, the number of components can be reduced, so that the reduction in production cost in accordance with component cost reduction and entire size of the sensor is possible.

Further, since the terminal 11C is formed by bending the circuit lead frame 11A so that the terminal 11C comes close to the pressure detecting element 2C relative to the circuit body 11D, the length of the wiring to be bonded can be shortened in wiring the circuit portion 11 and the pressure detecting element 2C.

Accordingly, workability can be improved, the possibility of short circuit between the wiring and the circuit portion 11 can be reduced and the reliability of the pressure sensor relative to vibration can be improved.

10) Since the terminal 12 includes the I/O terminal leads 12A and 12B and the common terminal lead 12C and the I/O terminal leads 12A and 12B and the common terminal 12C are formed of the lead frames, the terminal 12 can be directly soldered on a substrate.

11) In order to produce the pressure sensor 1, the pattern forming step for forming the circuit lead frame 11A and the terminal lead frame 12D from the metal plate 10, the mold step for providing the resin molds 14 and 15 to the metal plate 10 to hold the pattern, and the cutting step for cutting unnecessary part of the metal plate 10 are provided as the circuit board producing step. Accordingly, the resin molds 14 and 15 are provided on the lead frames 11A and 12D formed by the metal plate 10 to construct the basic arrangement of the circuit board 5 and the unnecessary part of the metal plate 10 is cut thereafter, thus automating the production of the circuit board 5. Therefore, the circuit board 5 can be easily produced and the assembly work of the pressure sensor 1 can be facilitated. Further, since unnecessary part of the metal plate is cut after attaching the IC die 16 on the metal plate 10, automation of the production of the circuit board 5 can be facilitated, the yielding rate can be improved and cost reduction can be attained.

12) Since the producing method of the pressure sensor 1 has the sensor module forming step for forming the sensor module 2 by providing the pressure detecting element 2C on the diaphragm 2A, the board attaching step for attaching the circuit board 5 produced by the circuit board producing step, and the wiring step for wiring the pressure detecting element 2C provided on the sensor module 2 with the circuit portion 11 of the circuit board 5, final pressure sensor 1 can be easily assembled by the series of appropriate production steps using the circuit board 5 produced by the circuit board producing step. Further, a plurality of connected circuit boards 5 can be produced by the series of the steps in rectangle-shape and hoop-shape.

13) Since the both of the circuit portion 11 and the terminal 12 have the SMT pads 11E and 12E for attaching the electronic components 18 on the lead frames 11A and 12D, protection circuit can be arranged by attaching the electronic components 18 on the SMT pads 11E and 12E to enhance function and reliability.

14) Since the lead frames 11A and 12D have the projection (ground terminal 12F) to be abutted to the conductive case 6, noise resistance can be improved.

15) Since the pressure sensor 1 includes the sensor module 2 for converting the received pressure into electric signal, the joint 3 for the sensor module 2 to be attached and having the pressure introducing port 3M thereinside, the flange 4 for fixing the joint 3 to a mount and the circuit board 5 attached to the flange 4 for amplifying the electric signal from the sensor module 2, the pressure sensor 1 can appropriately detect the pressure and can be installed on a predetermined mount.

16) Since the joint 3 and the flange 4 are independently formed, the flange 4 does not interfere in welding the joint 3 to the sensor module 2. Accordingly, it is not necessary to conduct welding in an unnatural direction such as inclined and perpendicular direction, so that alignment of weld line etc. can be easily conducted, thereby easily producing the pressure sensor 1.

17) Since the flange 4 is disposed so that the inner wall thereof opposes the sensor module 2, the sensor module 2 is sunk inside the flange 4 when the flange 4 is attached to the joint 3 to which the sensor module 2 is welded, thereby shortening the length of the pressure sensor itself.

18) Since the circuit board 5 is directly attached to the flange 4, no special attachment component such as spacer and terminal base is required in mounting the circuit board 5. Accordingly, the number of components can be reduced and the steps for assembling the components can be reduced, thereby facilitating the production of the pressure sensor.

[Second Embodiment]

Figure 12:
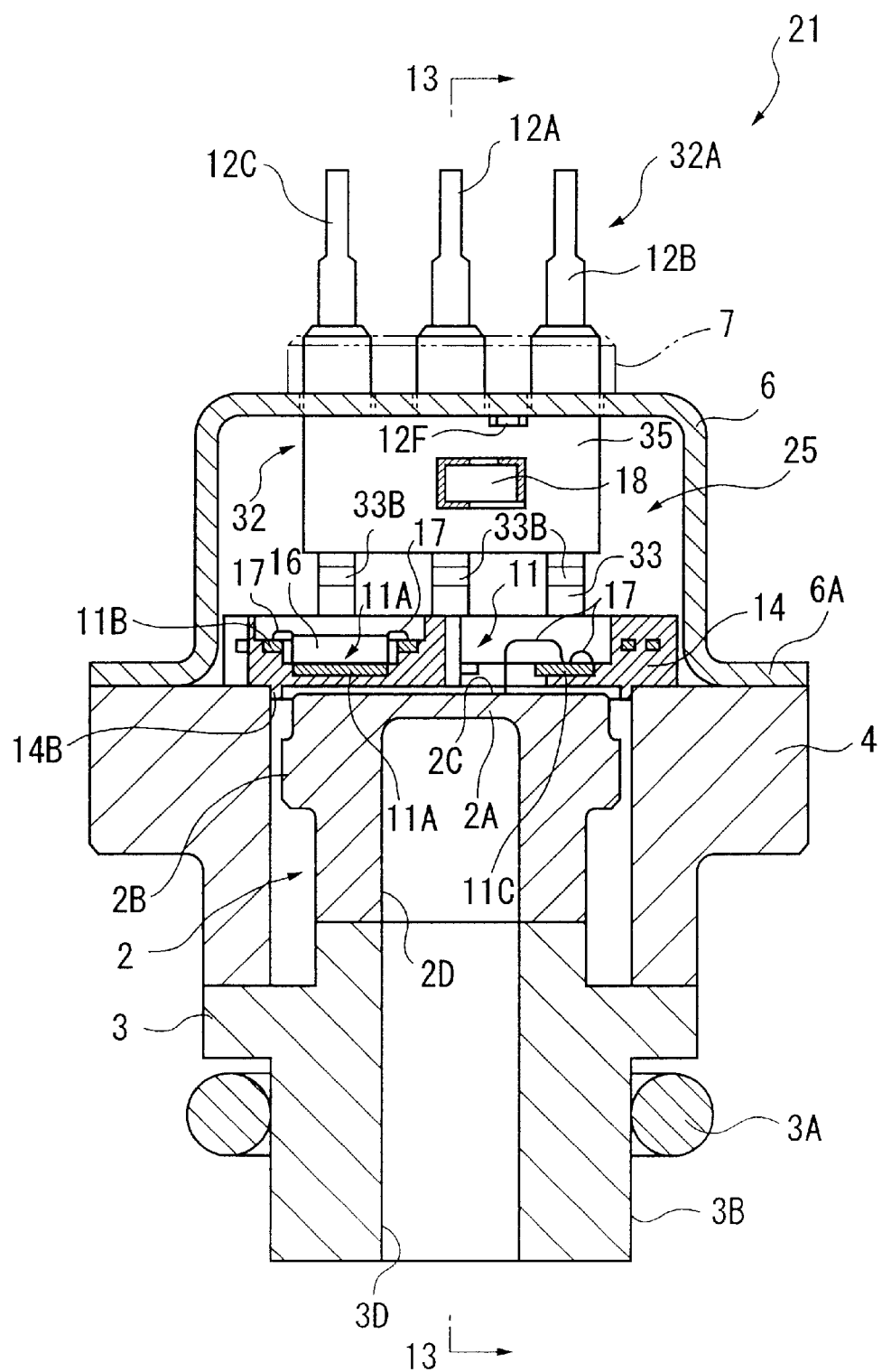
FIG. 12 is a view showing a pressure sensor according to second embodiment of the present invention, which corresponds to FIG. 1(B)
Figure 13:
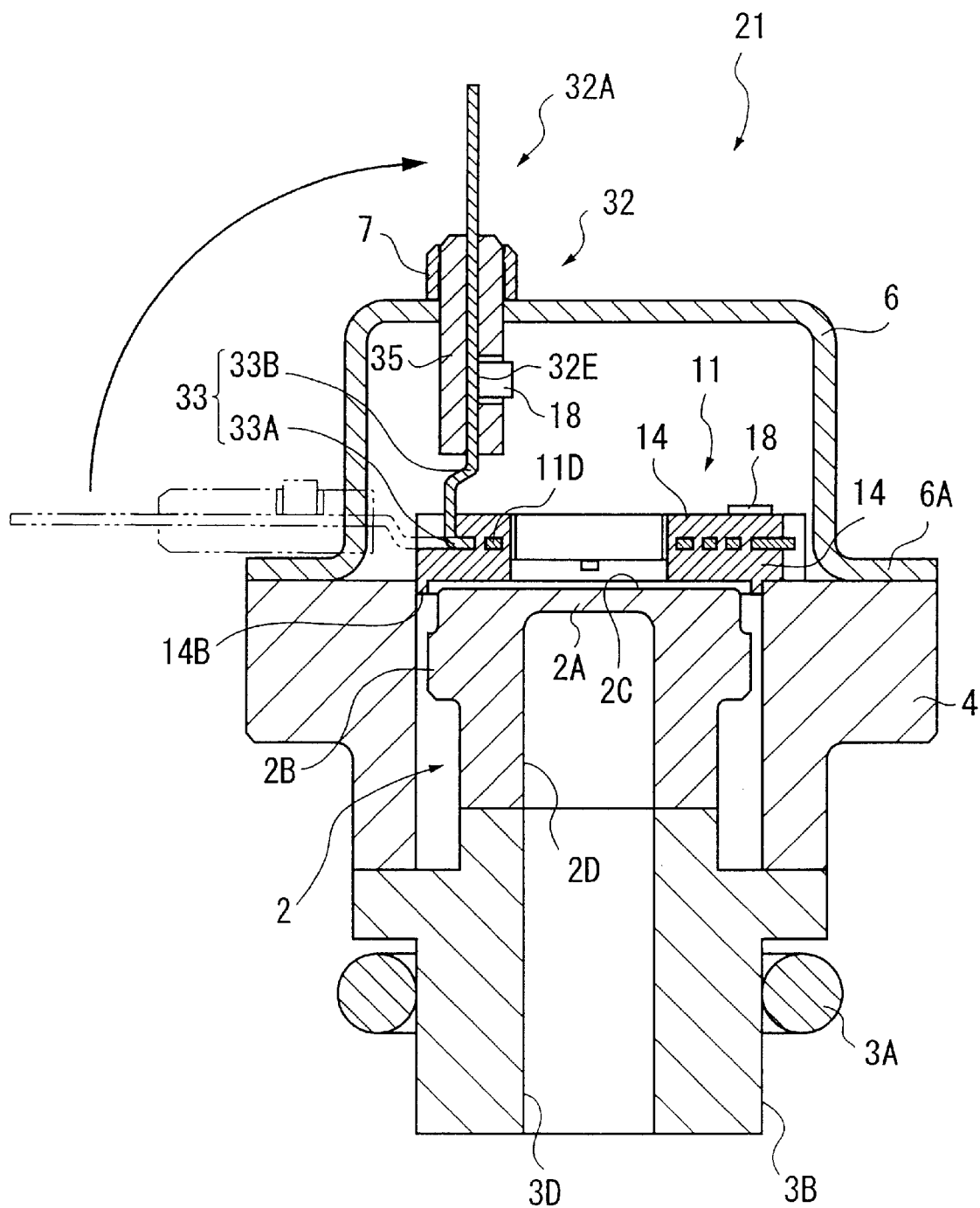
FIG. 13 is a view seen along 13—13 line of FIG. 12 in the arrowed direction.
Figure 14:
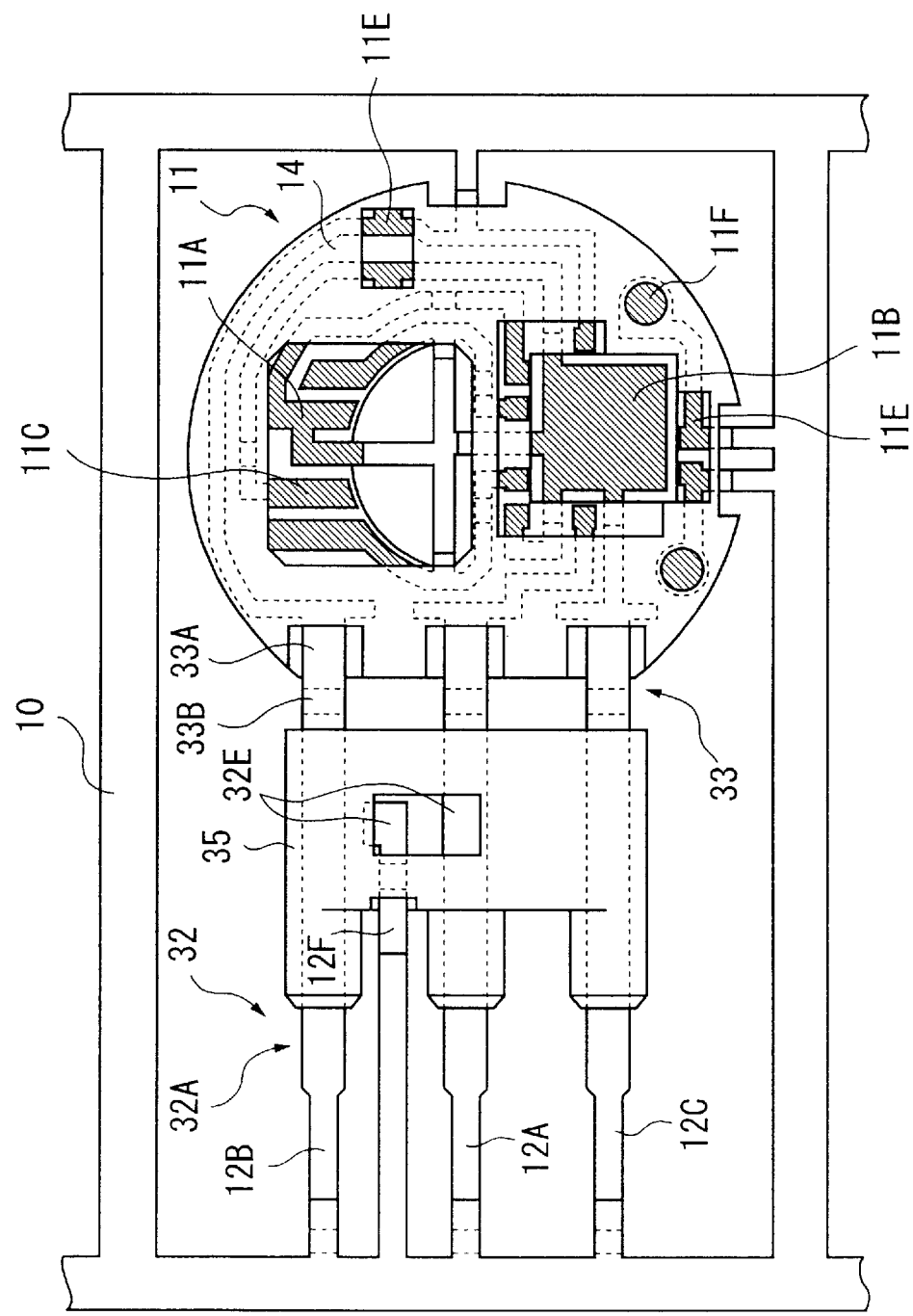
FIG. 14 is a view showing a metal plate according to the second embodiment of the present invention, which corresponds to FIG. 9.

FIGS. 12 to 14 show a pressure sensor 21 according to second embodiment of the present invention.

The pressure sensor 21 of the second embodiment has a structure of circuit board different from the first embodiment and the other arrangement is the same as the first embodiment. Incidentally, the same reference numerals will be attached to the components having the same function as the first embodiment to omit or simplify the description thereof.

FIG. 12 is a cross section of the pressure sensor 21 and FIG. 13 is a cross section taken along 13—13 line in FIG. 12 seen from arrowed direction.

In FIGS. 12 and 13, the pressure sensor 21 has a sensor module 2, a joint 3 attached with the sensor module 2 at the core thereof, a flange 4 provided on an end surface of the joint 3, a circuit board 25 and a conductive case 6 respectively provided to the flange 4, and a stopper 7 for preventing the circuit board 25 from falling off.

The circuit board 25 has a circuit portion 11 facing the diaphragm 2A, a terminal 32 for inputting/outputting the electric signal from the circuit portion 11 and a connector lead frame 33 for connecting the circuit board 11 with the terminal 32.

The terminal 32 has a terminal lead frame 32A and a terminal-side resin mold 35 provided to the terminal lead frame 32A.

The terminal lead frame 32A includes I/O terminal lead 12A and 12B, common terminal lead 12C and SMT pad 32E to which the electrical components are attached.

The terminal-side resin mold 35 is for holding the terminal lead frame 32A and for electric insulation, which is formed in an approximate thick plate orthogonal with the circuit portion 11 unlike the first embodiment.

A bent portion 33A for mounting the circuit portion 11 and the terminal 32 substantially at right angle, and a step portion 33B for escaping from the outside force applied through the terminal 32 are integrated to the connector lead frame 33.

The stopper 7 is provided on top of the conductive case 6 to prevent the terminal 32 from being pushed to the inside of the conductive case 6, which is made of plastic material etc.

As shown in FIG. 14, the circuit lead frame 11A, the terminal lead frame 32A and the connector lead frame 33 are made of flexible metal plate 10 and the circuit-side resin mold 14 and the terminal-side resin mold 35 is provided to a predetermined position of the metal plate 10.

Thus arranged pressure sensor 21 is produced in substantially the same manner as the pressure sensor 1 of the first embodiment.

Accordingly, in the second embodiment, in addition to the same function and advantages as 1) to 5) and 9) to 18) of the first embodiment, following effects and advantages can be obtained.

19) Since the stopper 7 is attached to the conductive case 6 and the insulative stopper 7 holds the terminal-side resin mold 35, the terminal 12 can be prevented from being erroneously pushed to the inside of the conductive case 6 by outside force.

20) Since the gasket is not used unlike the first embodiment, the conductive case 6 can be formed in a small size, thereby reducing the size of the pressure sensor 21.

[Modifications]

Incidentally, the scope of the present invention is not restricted to the above-described respective embodiments, but includes other arrangements capable of achieving an object of the present invention and below-described modifications are within the scope of the present invention.

Figure 15:
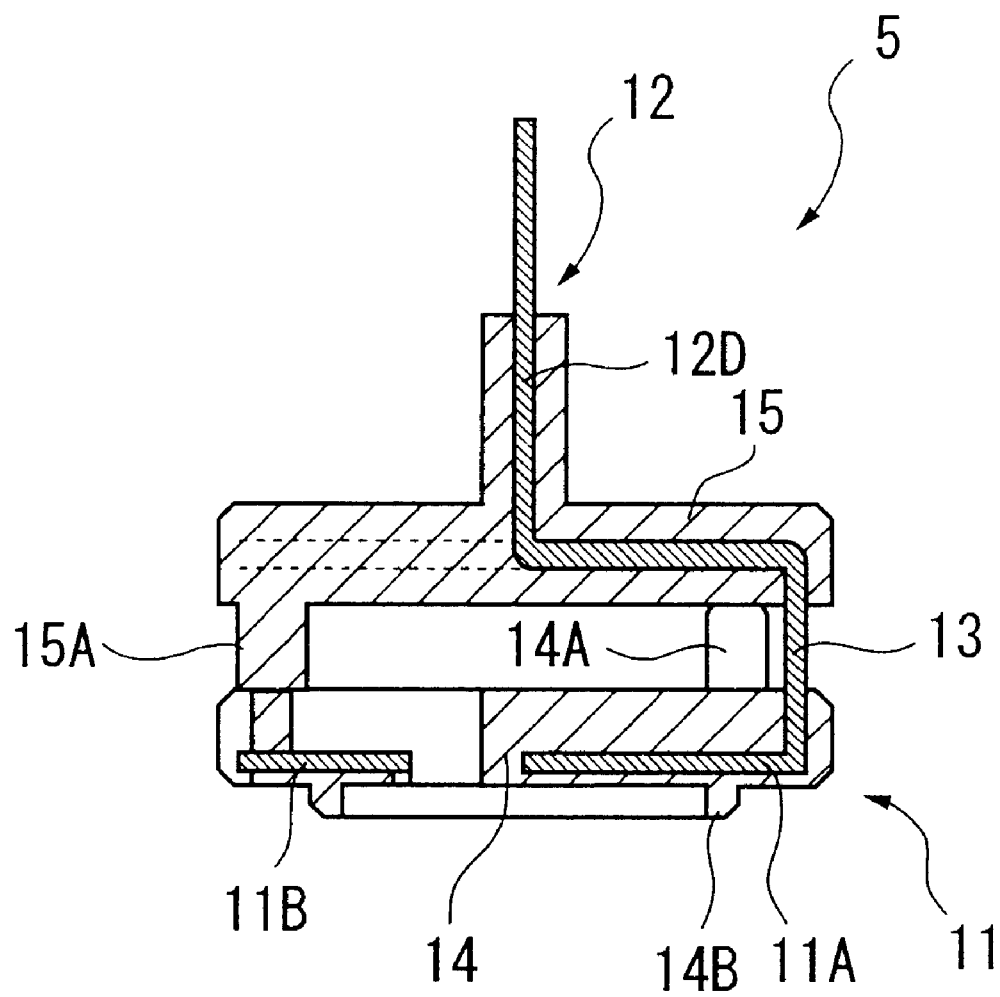
FIG. 15 is a cross section showing a circuit board according to another embodiment of the present invention.
Figure 16:
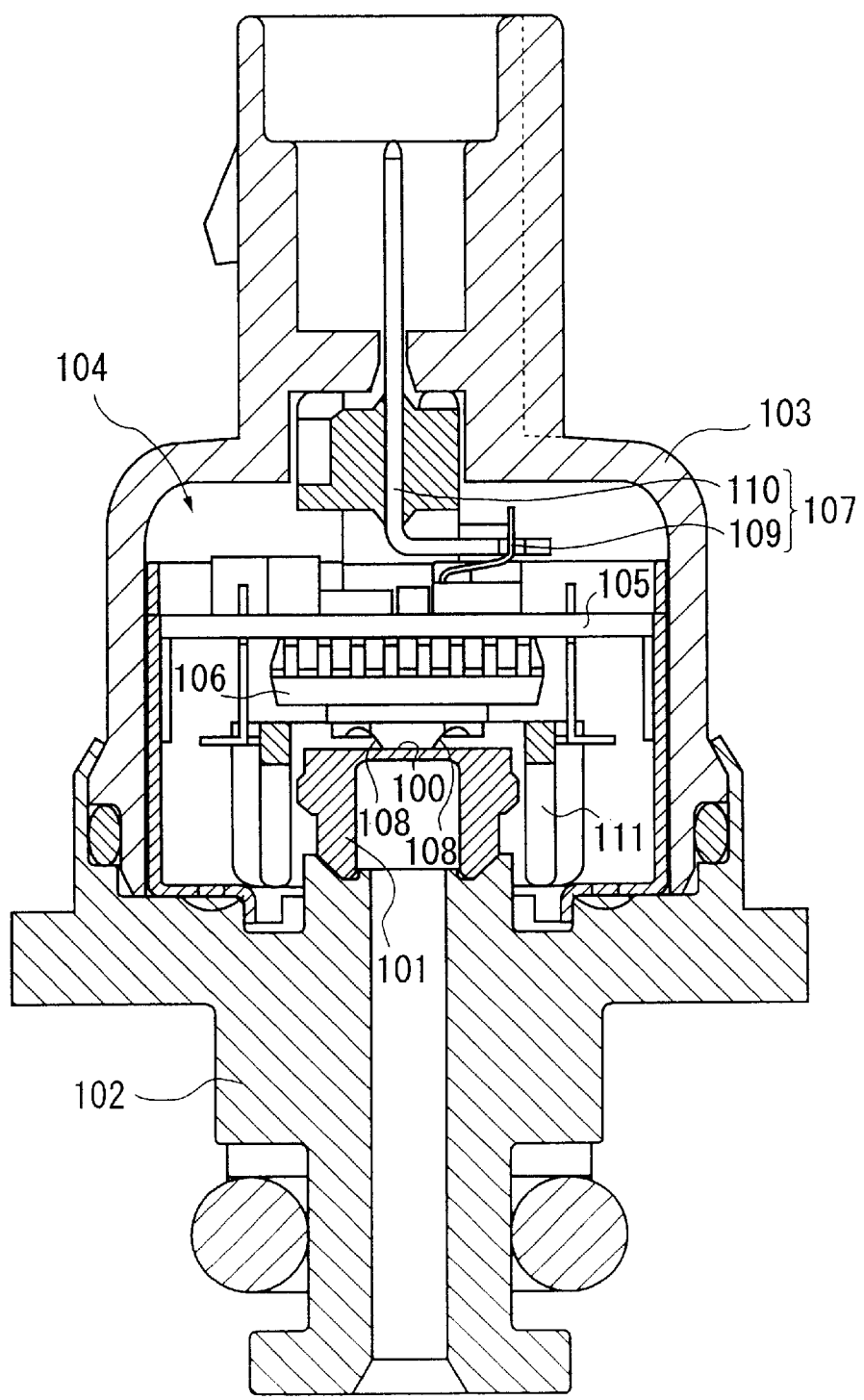
FIG. 16 is a cross section showing a first conventional example.
Figure 17:
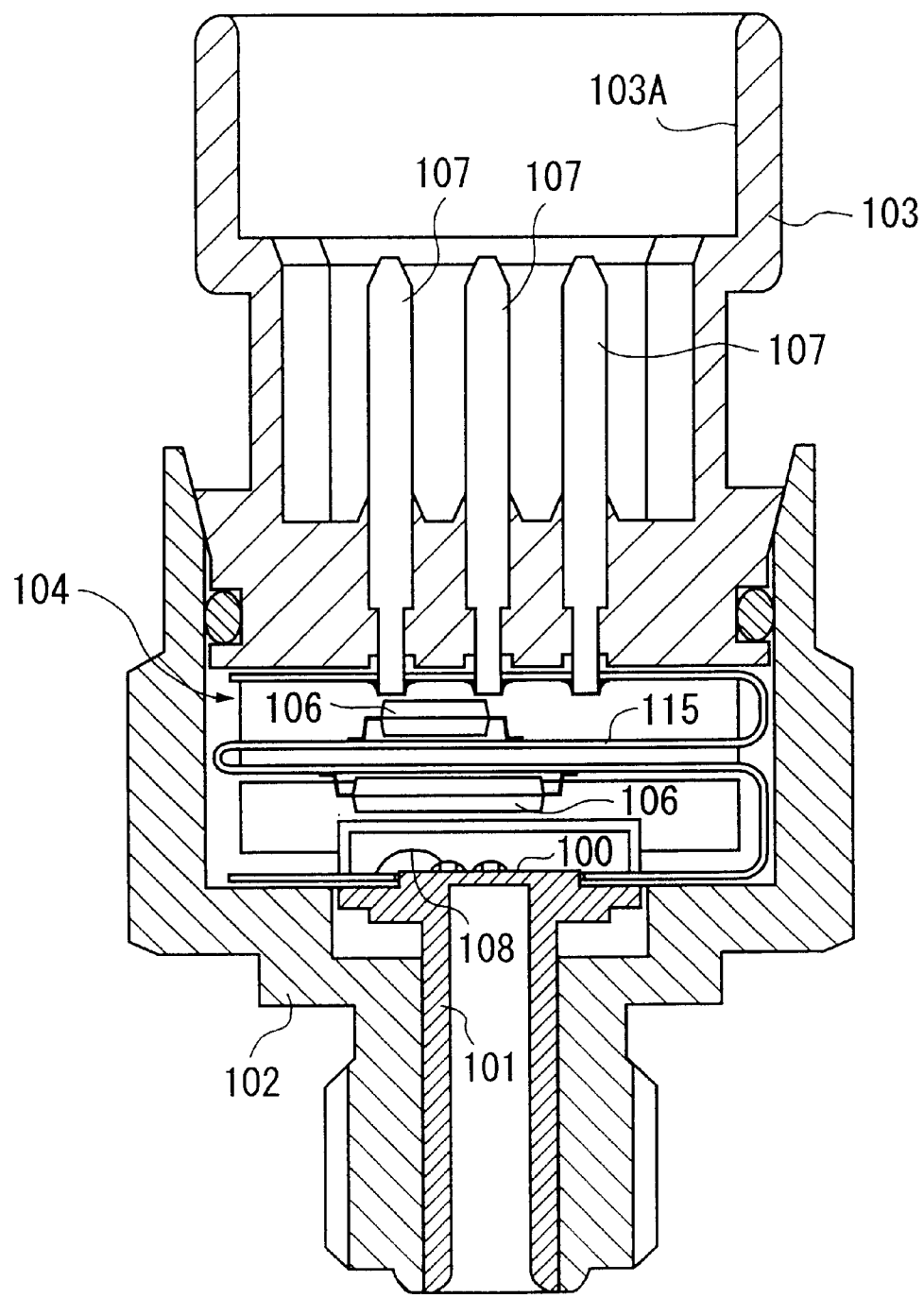
FIG. 17 is a cross section showing a second conventional example.
Figure 18:
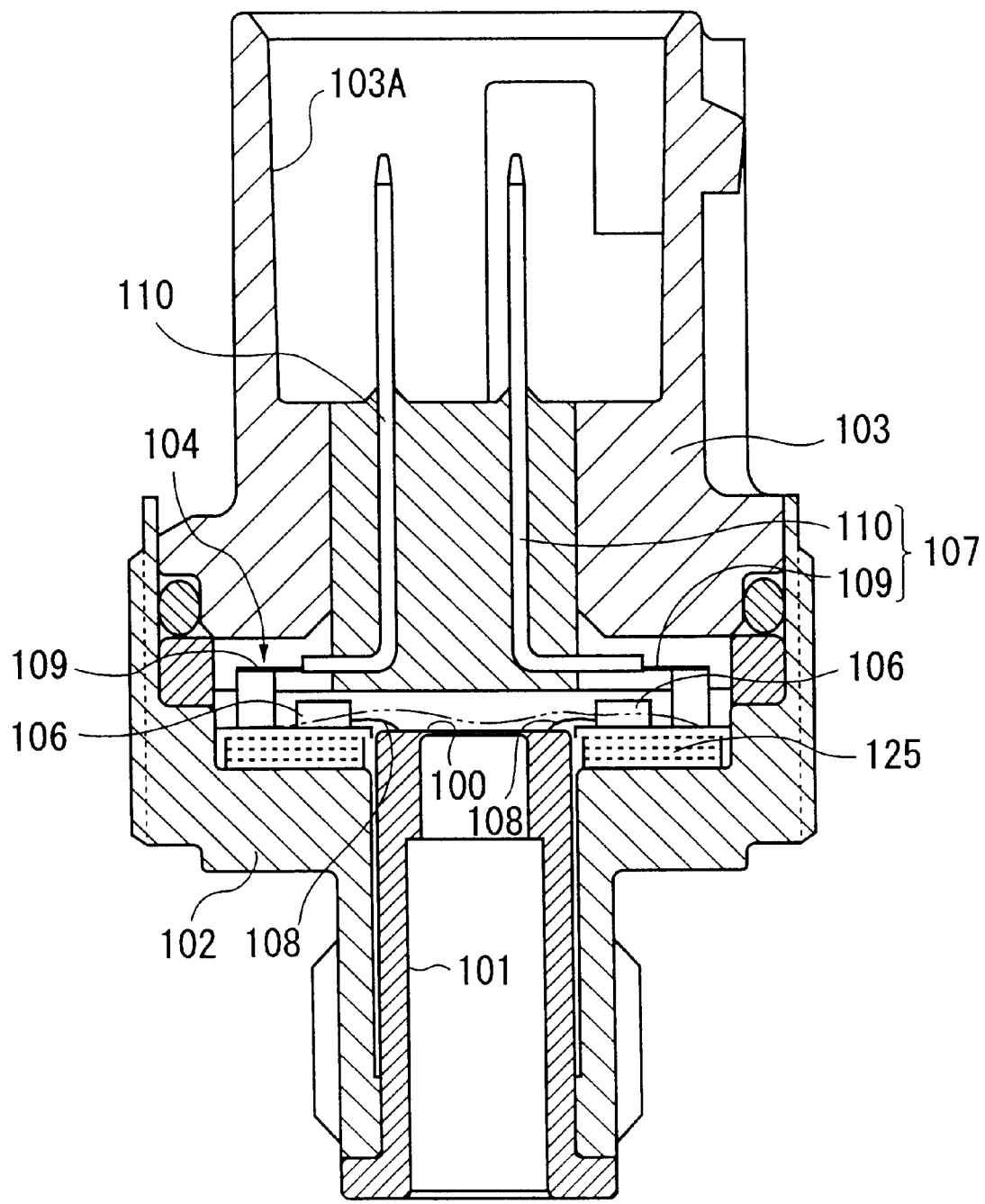
FIG. 18 is a cross section showing a third conventional example.
Figure 19:
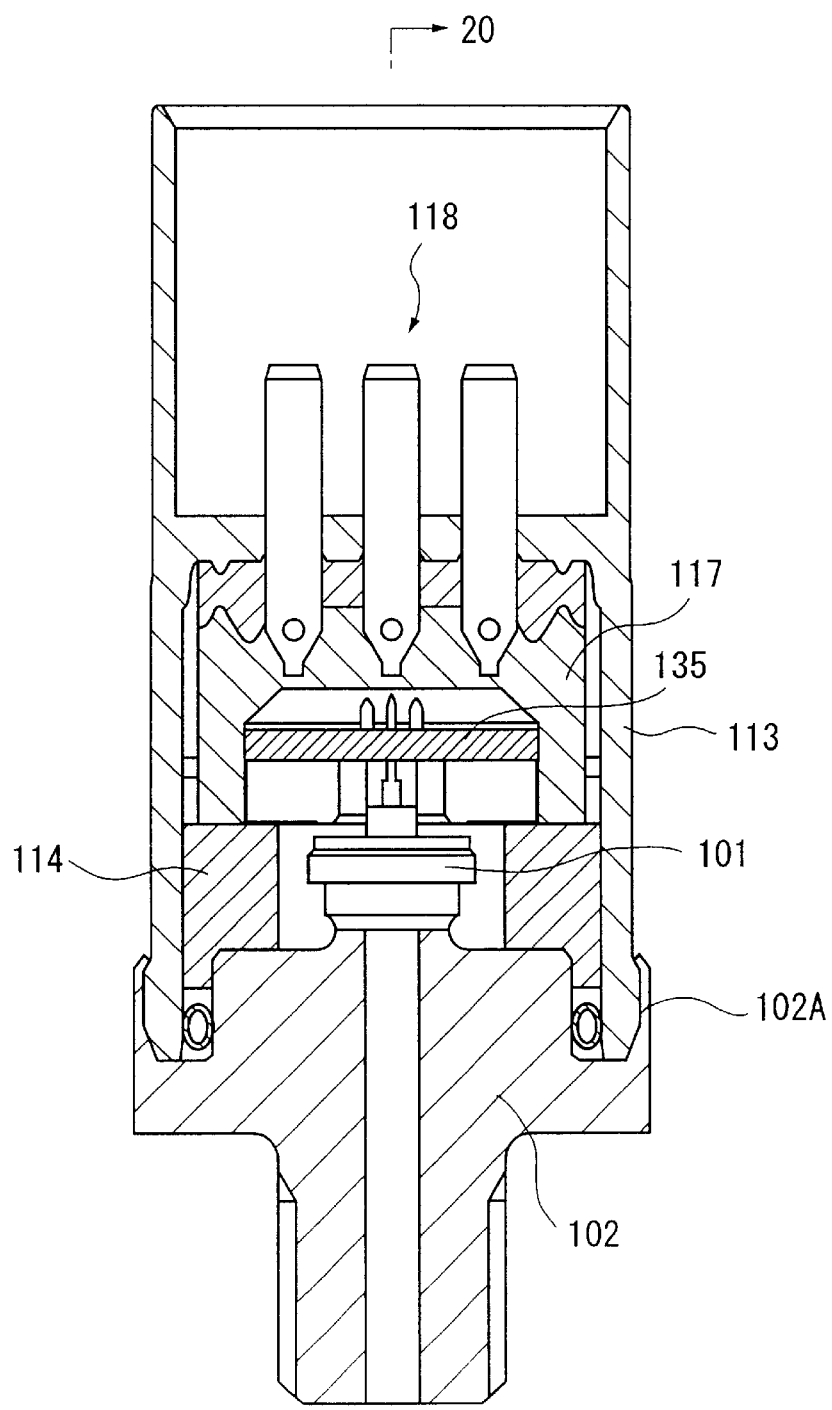
FIG. 19 is a cross section showing a fourth conventional example.
Figure 20:
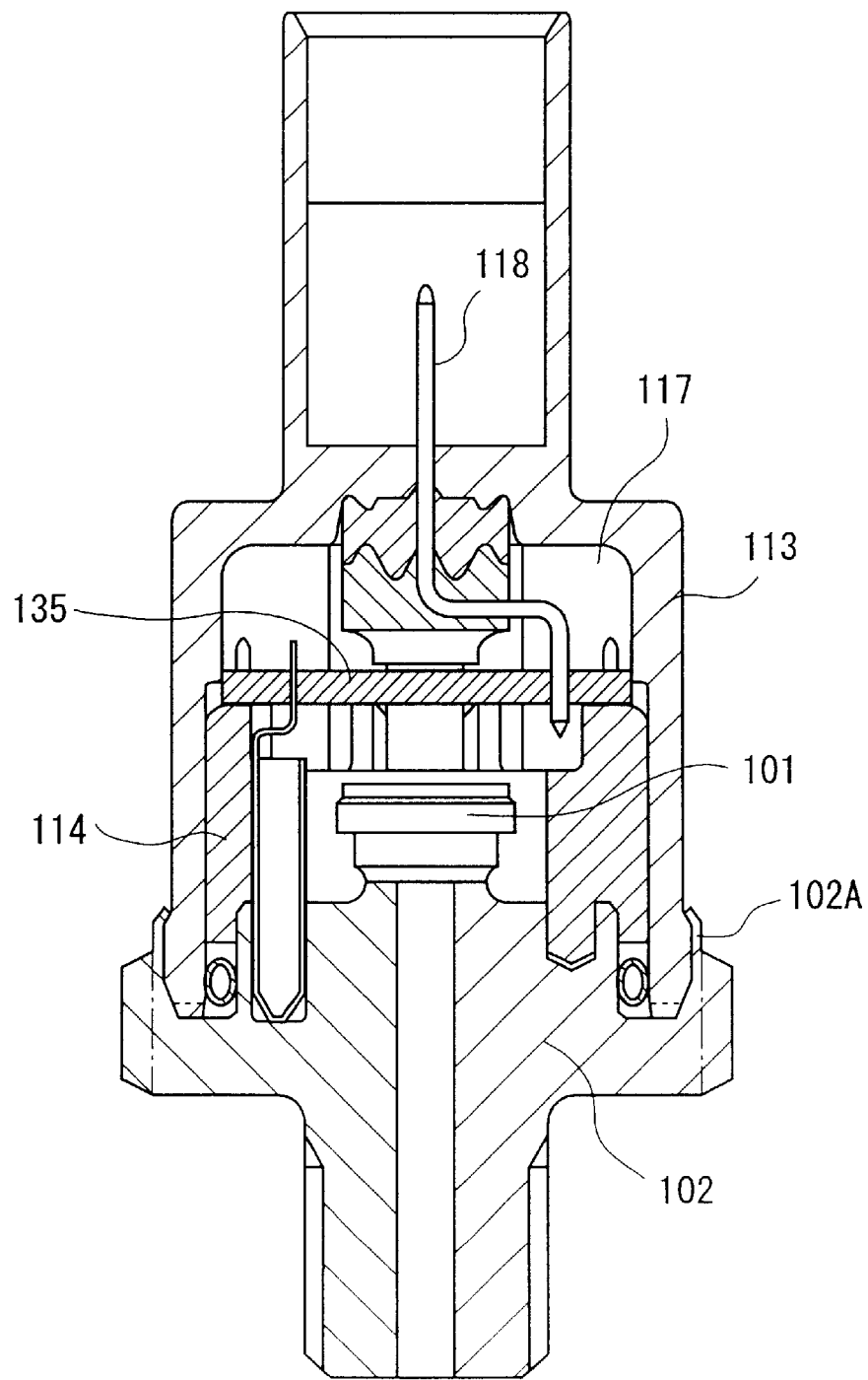
FIG. 20 is a view seen along 20—20 line of FIG. 19 in the arrowed direction.
Figure 21:
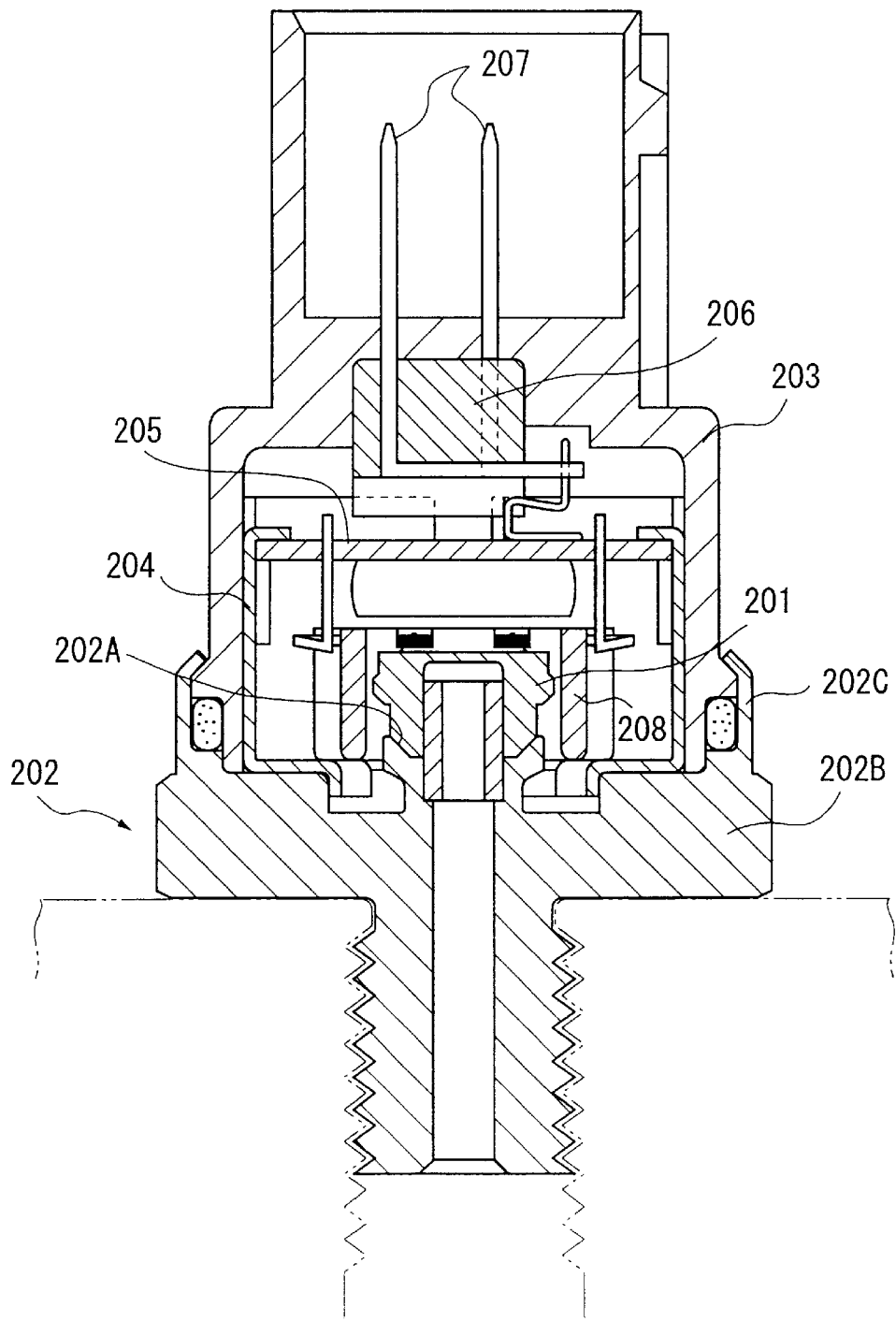
FIG. 21 is a cross section showing a fifth conventional example.

For instance, though the connector lead frame 13 for connecting the circuit portion 11 and the terminal 12 are naturally curved by bending process, the connector lead frame 13 may be bent in two perpendicular bend as shown in FIG. 15. Further, the two bending portions may be covered by the resin molds 14 and 15.

Though the sensor of the above embodiments are pressure sensors 1 and 21, the present invention can be applied to other sensors for detecting object other than pressure such as load.

Further, though the resin mold is provided on both of the circuit portion 11 and the terminal 12, the resin mold may be provided only on the circuit portion 11.

Further, the case 5 and the gasket 8 may not be provided in the present invention. When the case 6 is provided, the case 6 may not necessarily be electrically conductive. The stopper 7 may be omitted.

What is claimed is:

1. A sensor comprising:
    a circuit board having a circuit portion attached with an IC die for amplifying an electric signal detected by a detecting element; and
    a terminal for inputting and outputting the electric signal from the circuit portion;
    wherein the circuit portion includes a circuit lead frame and the terminal includes a terminal lead frame, the circuit lead frame and the terminal lead frame being formed by a metal plate, the metal plate being provided with a resin mold for electrically insulating the lead frames.

2. The sensor according to claim 1, wherein the resin mold includes a circuit-side resin mold provided to the circuit portion and a terminal-side resin mold provided to the terminal.

3. The sensor according to claim 2, further comprising a conductive case covering the circuit portion.

4. The sensor according to claim 3, wherein the terminal-side resin mold penetrates the conductive case.

5. The sensor according to claim 3, wherein a gasket is interposed between the conductive case and the terminal-side resin mold, and wherein a projection is formed on a part of the terminal-side resin mold facing the gasket.

6. The sensor according to claim 1, wherein the circuit portion and/or the terminal includes a SMT pad for attaching electrical components thereto.

7. The sensor according to claim 3, wherein the terminal lead frame has a projection abutted to the conductive case.

8. The sensor according to claim 2, wherein the circuit-side resin mold and the terminal-side resin mold are mutually opposed by bending the circuit lead frame relative to the terminal lead frame, and
    wherein a positioning projection is provided to the circuit-side resin mold and/or the terminal-side resin mold for determining the position of the circuit-side resin mold and the terminal-side resin mold.

9. The sensor according to claim 1, wherein a pad for attaching a wiring for connecting the detecting element and the circuit portion is provided to the circuit lead frame.

10. The sensor according to claim 9, wherein the lead frames are bent so that the pad for attaching the wiring is located closest to the detecting element in the circuit.

11. The sensor according to claim 1, wherein the terminal has an input terminal lead, an output terminal lead and a common terminal lead.

12. The sensor according to claim 1, the sensor being used for detecting pressure.

13. The sensor according to claim 2, wherein the detecting element is for detecting pressure, the sensor further comprising:
    a joint attached with the detecting element and having a pressure introducing port thereinside;
    a flange formed on the joint; and
    a case for accommodating the circuit board except for a part thereof, the case being attached to the flange,
    wherein the flange is disposed so that an inner wall thereof faces the detecting element, and the joint and the flange are independently formed.

14. The sensor according to claim 13, wherein the case is electrically conductive.

15. A pressure sensor comprising:

a support base;

a pressure-detecting element received in the support base;

a flange surrounding the support base;

a circuit board including a circuit portion for amplifying an electric signal output by said pressure detecting element, said circuit portion including a circuit lead frame;

a terminal for outputting the amplified electric signal, said terminal including a terminal lead frame;

a connector for connecting said circuit portion and said terminal, said connector including a connector lead frame; and a case secured to the flange, wherein said circuit lead frame, said terminal lead frame, and said connector lead frame are formed from a flexible metal plate.

16. The pressure sensor according to claim 15, including a terminal-side resin mold provided to a terminal side of the metal plate and a circuit-side resin mold provided to a circuit portion side of the metal plate.

17. The pressure sensor according to claim 16, including wiring connecting the pressure-detecting element to the circuit portion.

18. The pressure sensor according to claim 15, wherein said terminal lead frame includes an input terminal lead, an output terminal lead, a common terminal lead and a ground terminal lead.

19. The pressure sensor according to claim 16, wherein the case comprises a conductive case enclosing the circuit board and the pressure sensor includes a gasket interposed between the case and the terminal-side resin mold.

20. The pressure sensor according to claim 19, including a projection formed on a part of the terminal-side resin mold facing the gasket.

* * * * *